United States Patent
Huang et al.

(10) Patent No.: US 11,575,358 B2
(45) Date of Patent: *Feb. 7, 2023

(54) THIN-FILM BULK ACOUSTIC RESONATOR AND SEMICONDUCTOR APPARATUS COMPRISING THE SAME

(71) Applicants: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

(72) Inventors: Herb He Huang, Shanghai (CN); Clifford Ian Drowley, Shanghai (CN); Jiguang Zhu, Shanghai (CN); Haiting Li, Shanghai (CN)

(73) Assignees: SEMICONDUCTOR MANUFACTURING INTERNATIONAL (SHANGHAI) CORPORATION, Shanghai (CN); NINGBO SEMICONDUCTOR INTERNATIONAL CORPORATION, Ningbo (CN)

( * ) Notice: Subject to any disclaimer, the term of this patent is extended or adjusted under 35 U.S.C. 154(b) by 338 days.

This patent is subject to a terminal disclaimer.

(21) Appl. No.: 15/931,994

(22) Filed: May 14, 2020

(65) Prior Publication Data
US 2020/0280294 A1    Sep. 3, 2020

Related U.S. Application Data

(62) Division of application No. 15/453,364, filed on Mar. 8, 2017, now Pat. No. 10,693,431.

(51) Int. Cl.
H03H 3/02    (2006.01)
H03H 9/10   (2006.01)
(Continued)

(52) U.S. Cl.
CPC .............. H03H 3/02 (2013.01); H01L 27/20 (2013.01); H03H 9/105 (2013.01);
(Continued)

(58) Field of Classification Search
CPC .. H01L 27/20; H03H 9/02007; H03H 9/1035; H03H 9/171; H03H 9/173; H03H 9/587
See application file for complete search history.

(56) References Cited

U.S. PATENT DOCUMENTS 6,987,347 B2    1/2006 Yoshio et al.
2005/0275696 A1   12/2005 Miyazawa et al.
(Continued)

FOREIGN PATENT DOCUMENTS

CN    1929302 A    3/2007
CN    103001602 A   3/2013
(Continued)

OTHER PUBLICATIONS

European Search Report Application No. 17158747.0, dated Aug. 10, 2017, p. 1-11.

Primary Examiner — Jeffrey M Shin
(74) Attorney, Agent, or Firm — Anova Law Group, PLLC

(57) ABSTRACT

A thin-film bulk acoustic resonator, a semiconductor apparatus including the acoustic resonator and its manufacturing method are presented. The thin-film bulk acoustic resonator includes a lower dielectric layer, a first cavity inside the lower dielectric layer, an upper dielectric layer, a second cavity inside the upper dielectric layer, and a piezoelectric film that is located between the first and second cavities and
(Continued)

continuously separates these two cavities. The plan views of the first and the second cavities have an overlapped region, which is a polygon that does not have any parallel sides. The piezoelectric film of this inventive concept is a continuous film without any through-hole in it, therefore it can offer improved acoustic resonance performance.

12 Claims, 16 Drawing Sheets

(51) Int. Cl.
  *H03H 9/17* (2006.01)
  *H03H 9/56* (2006.01)
  *H01L 27/20* (2006.01)

(52) U.S. Cl.
  CPC .......... *H03H 9/1035* (2013.01); *H03H 9/171* (2013.01); *H03H 9/173* (2013.01); *H03H 9/564* (2013.01); *H03H 2003/021* (2013.01); *H03H 2003/023* (2013.01); *Y10T 29/42* (2015.01); *Y10T 29/49005* (2015.01)

(56) References Cited

U.S. PATENT DOCUMENTS

| | | |
|---|---|---|
| 2006/0006768 A1 | 1/2006 | Ishii |
| 2006/0131731 A1 | 6/2006 | Sato |
| 2013/0120081 A1 | 5/2013 | Zuo et al. |
| 2014/0176261 A1 | 6/2014 | Burak et al. |
| 2017/0207764 A1* | 7/2017 | Wang ................ H03H 9/02118 |

FOREIGN PATENT DOCUMENTS

| | | |
|---|---|---|
| CN | 107181469 A | 9/2017 |
| CN | 107181472 A | 9/2017 |
| JP | 2002033637 A | 1/2002 |
| JP | 2003309445 A | 10/2003 |
| JP | 2007142372 A | 6/2007 |

* cited by examiner

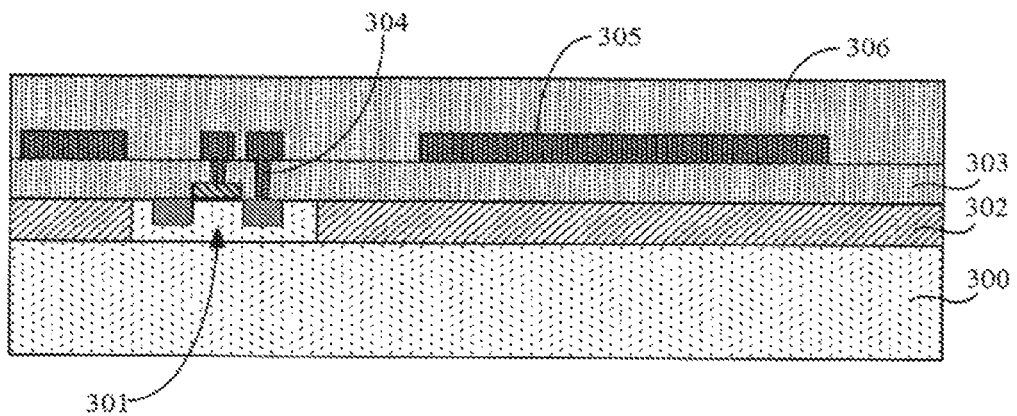
Fig. 3A
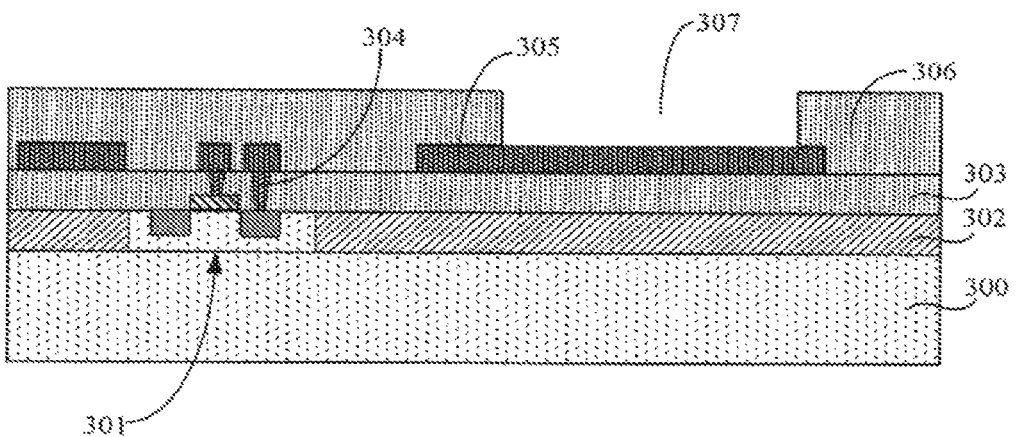
Fig. 3B1
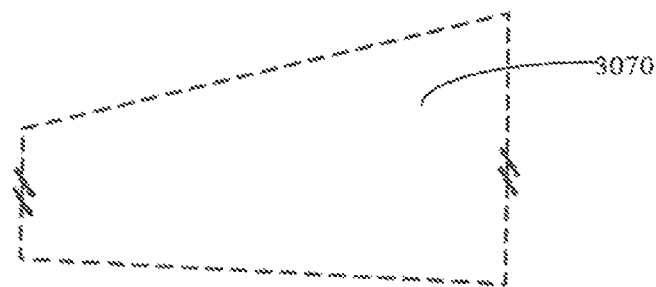
Fig. 3B2

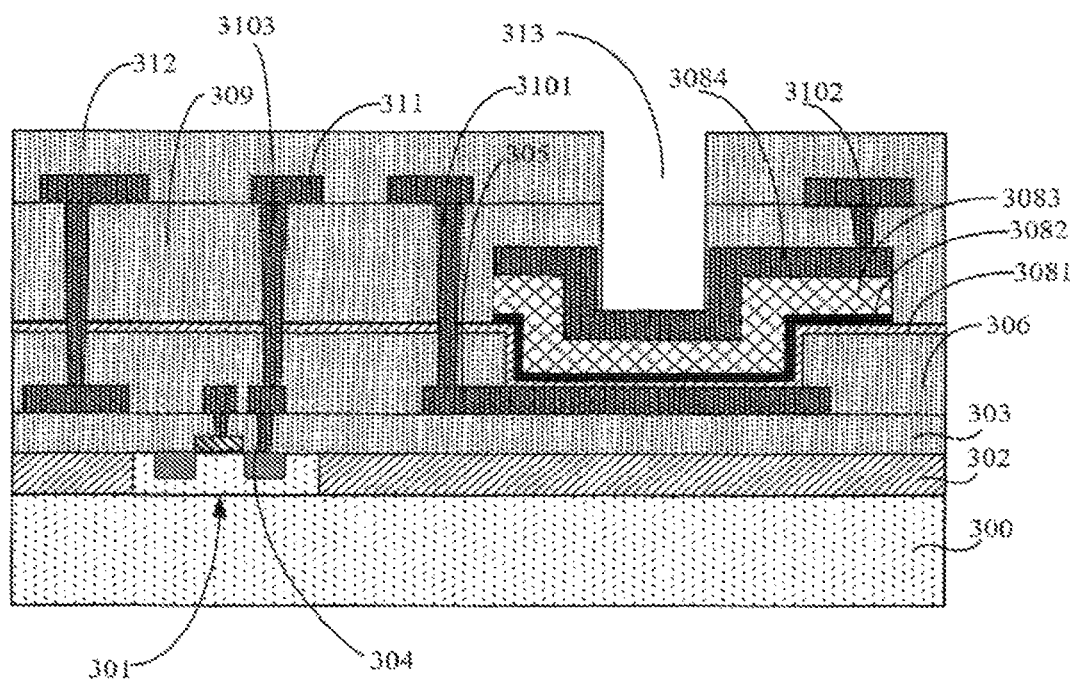
Fig. 3F1
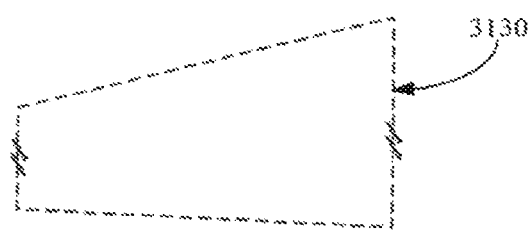
Fig. 3F2

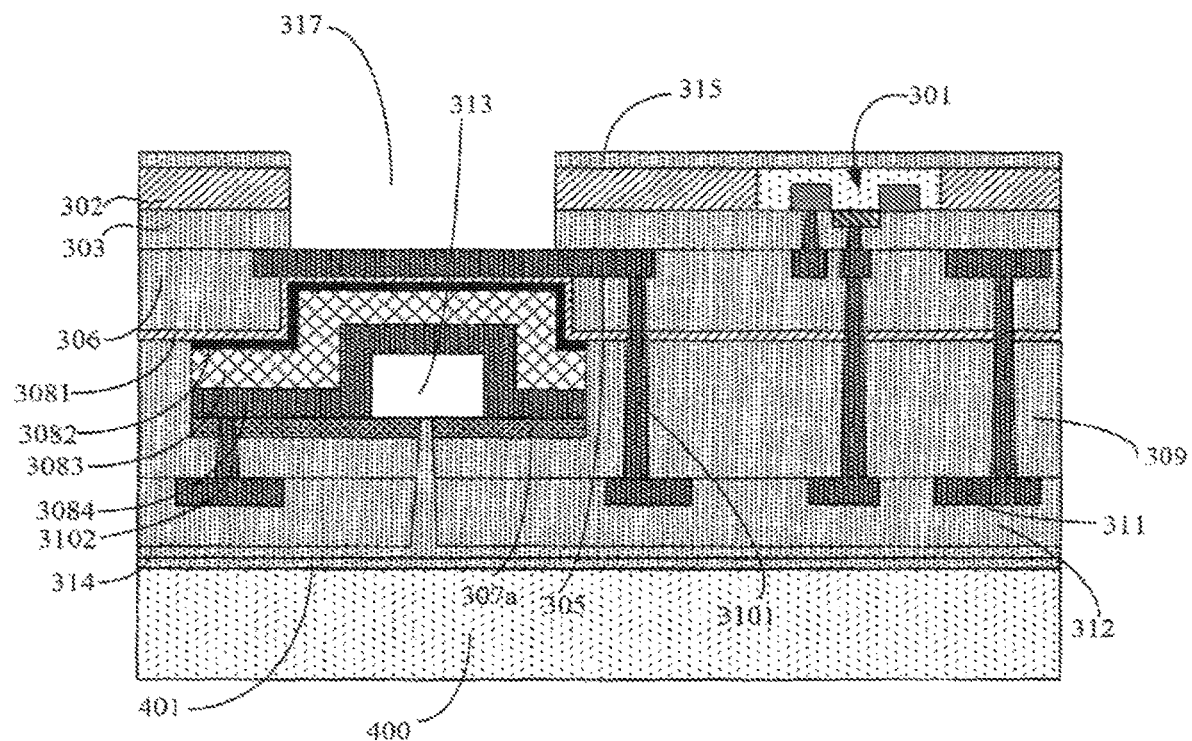
Fig. 3O1
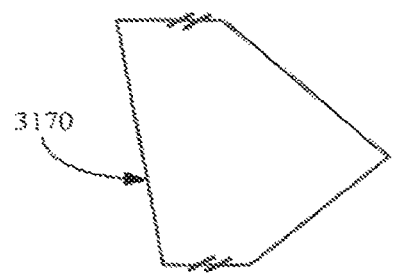
Fig. 3O2

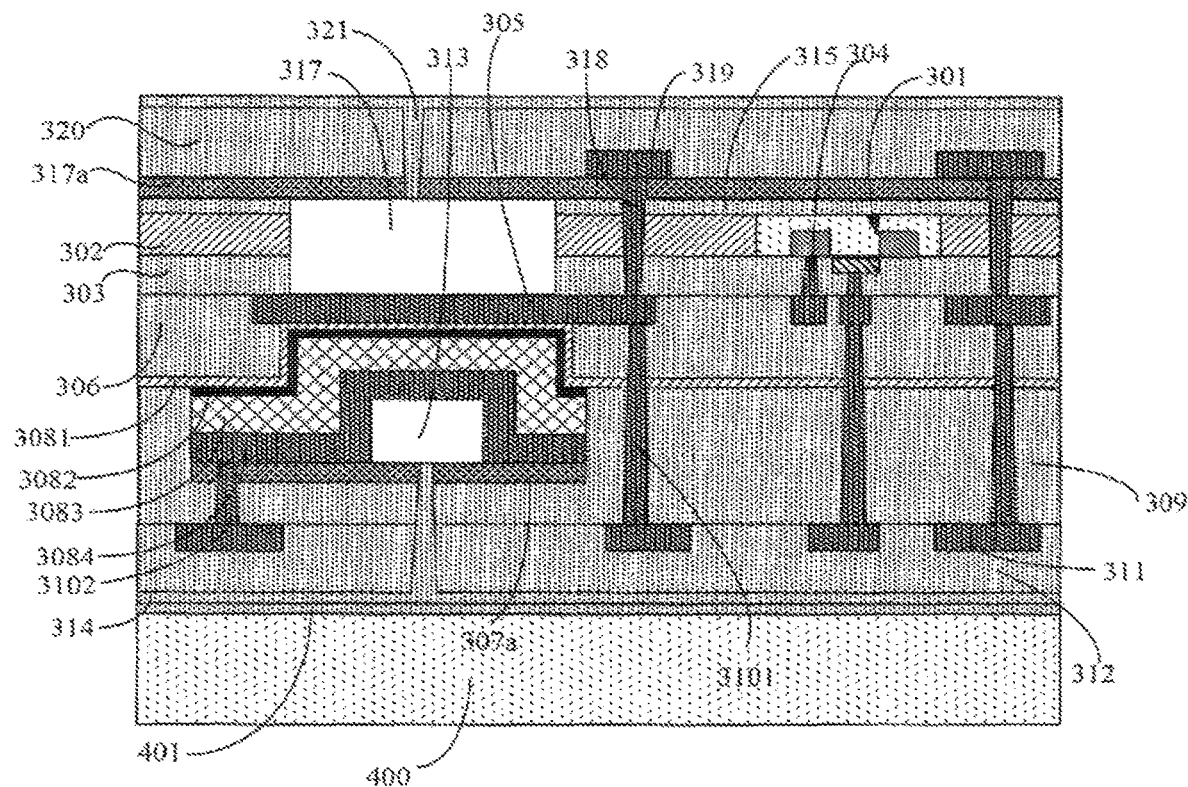
Fig. 3S1
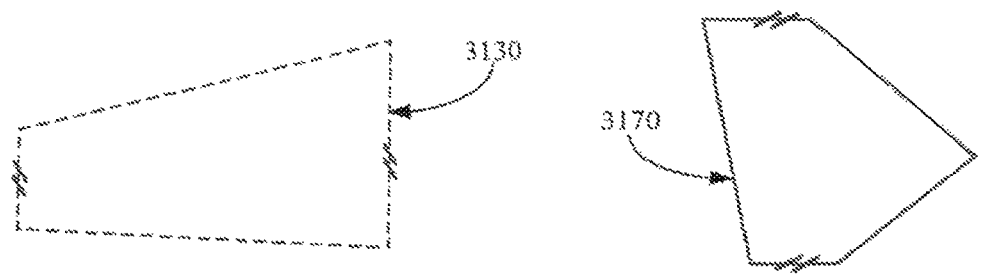
Fig. 3S2 Fig. 3S3

THIN-FILM BULK ACOUSTIC RESONATOR AND SEMICONDUCTOR APPARATUS COMPRISING THE SAME

CROSS REFERENCE TO RELATED APPLICATIONS

This application is a divisional of U.S. patent application Ser. No. 15/453,364, filed on Mar. 8, 2017, which claims priority to and benefit of Chinese Patent Application No. 201610136358.6 filed on Mar. 10, 2016, all of which is incorporated herein by reference in their entirety.

BACKGROUND

(a) Field of the Invention

The present inventive concept relates to a film bulk acoustic resonator, a semiconductor apparatus comprising of such an acoustic resonator, and the manufacturing methods thereof.

(b) Description of the Related Art

Thin-film Bulk Acoustic Resonator (FBAR) is a micro-electro-mechanical (MEMS) based radio frequency (RF) device that has been widely used in wireless devices such as cell phone. FBAR device offers high signal sensitivity, wide frequency response spectrum, and good output linearity. It also has a small footprint and can be integrated into existing complementary metal-oxide-semiconductor (CMOS) fabrication processes.

FIG. 1 depicts an example of a conventional FBAR. In manufacturing the structure of FIG. 1, a cavity 101 is first formed in a substrate 100, then the cavity 101 is filled with a sacrificial material (not shown). Then a lower electrode layer 102, an acoustic resonator film 103, and an upper electrode layer 104 are formed, respectively, on the substrate 100 and the sacrificial material. The acoustic resonator film 103 may comprise a piezoelectric film, one or more adhesive layer, and one or more dielectric layer. In order to remove the sacrificial material now buried underneath the lower electrode layer 102, a hole 105 has to be made to penetrate the upper electrode layer 104, the acoustic resonance film 103, and the lower electrode layer 102, respectively, to reach the sacrificial material. The sacrificial material then can be removed by a wet etching process through the hole 105. The hole 105 has some undesirable effects in that it weakens the integrity of the lower electrode layer 102, the acoustic resonance film 103, and the upper electrode layer 104, adversely affecting the performance of the FBAR. Therefore a new acoustic resonator design that eliminates the need for the hole 105 is desired.

SUMMARY

This summary is related to some of many embodiments of the inventive concept disclosed herein and is not intended to limit the scope of this inventive concept.

A thin-film bulk acoustic resonator (FBAR) apparatus, comprising:
a lower dielectric layer;
a first cavity inside the lower dielectric layer;
an upper dielectric layer on the lower dielectric layer;
a second cavity inside the upper dielectric layer; and
an acoustic resonance film that is positioned between and separating the first and the second cavities, wherein the acoustic resonance film includes a lower electrode layer, an upper electrode layer, and a piezoelectric film that is sandwiched between the lower and upper electrode layers, and wherein the plan views of the first and the second cavities have an overlapped region having an outline of a polygonal shape without any parallel sides.

Additionally, the plan view of the first cavity has an outline of a first polygon, which has at least one pair of parallel sides.

Additionally, the plan view of the second cavity has an outline of a second polygon, which has at least one pair of parallel sides.

Additionally, the acoustic resonance film further comprises:
an adhesive layer that is positioned between the piezoelectric film and the lower electrode layer; and
one or more insulation layers positioned in one or both of: between the adhesive layer and the lower electrode layer, and between the piezoelectric film and the upper electrode layer.

The inventive concept further presents a semiconductor apparatus, comprising:
an isolation trench layer;
a first dielectric layer formed on a first side of the isolation trench layer;
a lower electrode layer formed on the first dielectric layer, the lower electrode layer being above the isolation trench layer and the first dielectric layer being positioned between the the lower electrode layer and the isolation trench layer;
a second dielectric layer formed on the first dielectric layer and the lower electrode layer;
an opening in the second dielectric layer, the opening exposing part of the lower electrode layer and having a plan view in the shape of a polygon;
a piezoelectric film formed to cover part of the second dielectric layer and fill part of the opening;
an upper electrode layer formed on the piezoelectric film;
a third dielectric formed to cover both the upper electrode layer and the second dielectric layer;
a first cavity formed in the third dielectric layer, the first cavity having a plan view in the shape of a first polygon;
a fourth dielectric layer formed on a second side of the isolation trench layer, so that the isolation trench layer is positioned between the fourth dielectric layer and the first dielectric layer;
a second cavity extending through the fourth dielectric layer, the isolation trench layer, and the first dielectric layer and having a plan view of a second polygon, the first and second cavities facing each other and their plan views forming an overlapped region with an outline in the shape of a third polygon that does not have any parallel sides; and
an acoustic resonance film comprising the lower electrode layer, the piezoelectric film, and the upper electrode layer.

Additionally, the aforementioned semiconductor apparatus further comprises a fifth dielectric layer on the third dielectric layer.

Additionally, the aforementioned semiconductor apparatus further comprises:
a first assistant substrate; and
a first bonding layer formed on the first assistant substrate and being bonded with the fifth dielectric layer to seal the first cavity, wherein the first cavity extending through the third and fifth dielectric layers and exposing at least part of the upper electrode layer.

Additionally, the aforementioned semiconductor apparatus further comprises:
- a first cover layer positioned between the third dielectric layer and part of the upper electrode layer and sealing the first cavity; and
- at least one first release hole extending through a portion of the first cover layer, the third dielectric layer, and the fifth dielectric layer that are on top of the first cavity, wherein the first release hole is filled and sealed by a first filling material, wherein the first filling material also covers the upper surface of the fifth dielectric layer.

Additionally, the aforementioned semiconductor apparatus further comprises:
- a second assistant substrate; and
- a second bonding layer formed on the second assistant substrate and being bonded with the fourth dielectric layer to seal the second cavity.

Additionally, the aforementioned semiconductor apparatus further comprises:
- a second cover layer formed on the surface of the fourth dielectric layer and sealing the second cavity; and
- at least one second release hole extending through a portion of the second cover layer that is facing the second cavity and being filled and sealed by a second filling material.

Additionally, the aforementioned semiconductor apparatus further comprises:
- a contact hole extending through the fourth dielectric layer, the isolation trench layer, the first dielectric layer, and the piezoelectric film to electrically connect to the upper electrode layer, wherein the contact hole comprises a liner layer and a conductive material inside.

Additionally, the acoustic resonance film in the aforementioned semiconductor apparatus further comprises:
- an adhesive layer positioned between the piezoelectric film and the lower electrode layer; and
- one or more insulation layer positioned in at least one of: between the lower electrode layer and the adhesive layer, and between the upper electrode layer and the piezoelectric film.

This inventive concept further presents a method for manufacturing a semiconductor apparatus, comprising:
- providing a base substrate;
- forming an isolation trench layer on a first side of the base substrate;
- forming a first dielectric layer on the isolation trench layer, wherein the isolation trench layer being positioned between the base substrate and the first dielectric layer;
- forming a lower electrode layer on part of the first dielectric layer, the lower electrode layer is also above the isolation trench layer;
- forming a second dielectric layer to cover the lower electrode layer;
- forming an opening in the second dielectric layer, the opening exposing part of the lower electrode layer and having a plan view in the shape of a polygon;
- forming a piezoelectric film to cover the upper surface of the second dielectric layer and the bottom and side surfaces of the opening;
- forming an upper electrode layer on the piezoelectric film;
- patternizing the piezoelectric film and the upper electrode layer, retaining a portion of the piezoelectric film and the upper electrode layer in the opening;
- forming a third dielectric layer to cover the upper electrode layer and the second dielectric layer;
- forming a first cavity in the third dielectric layer, the first cavity exposing at least part of the upper electrode layer and having a plan view in the shape of a first polygon;
- providing a first assistant substrate;
- forming a first bonding layer on the first assistant substrate;
- bonding the first bonding layer with the third dielectric layer to seal the first cavity;
- removing the base substrate to expose the isolation trench layer;
- forming a fourth dielectric layer on a side of the isolation trench layer that is opposing to the side that contacts the first dielectric layer, so that the isolation trench layer is positioned between the fourth dielectric layer and the first dielectric layer;
- etching through the fourth dielectric layer, the isolation trench layer, the first dielectric layer to expose part of the lower electrode layer and form a second cavity beneath the lower electrode layer, wherein the second cavity is facing the first cavity and has a plan view of a second polygon, the plan views of the first and second cavities have an overlapped region that forms a shape of a third polygon that does not have any parallel sides; and
- sealing the second cavity.

Additionally, the aforementioned method further comprises:
- forming a fifth dielectric layer to cover the third dielectric layer after the third dielectric layer is formed but before the first cavity is formed.

Additionally, in the aforementioned method, the method to form the first cavity comprises:
- etching through the fifth dielectric layer and the third dielectric layer to expose at least part of the upper electrode layer to form the first cavity.

Additionally, the aforementioned method further comprises:
- forming a first sacrificial material layer to cover the upper electrode layer;
- conducting a planarization process on the first sacrificial material layer until the upper electrode layer is reached;
- forming a first cover layer on the upper electrode layer and the first sacrificial material layer; and
- patternizing the first cover layer, the piezoelectric layer, and the upper electrode layer before patternizing the piezoelectric film and the upper electrode layer.

Additionally, in the aforementioned method, the method to form the first cavity comprises:
- forming at least one first release hole that goes through the fifth dielectric layer, the third dielectric layer, and the first cover layer to expose the first sacrificial layer;
- removing the first sacrificial material layer through the first release hole; and
- filling the first release hole with the first filling material to seal the first cavity.

Additionally, the aforementioned method further comprises:
- forming a contact hole that goes through the fourth dielectric layer, the isolation trench layer, the first dielectric layer, and the piezoelectric film to electrically connect to the upper electrode layer after the fourth dielectric layer is formed but before the second cavity is formed, wherein the contact hole comprises a liner layer inside and is filled with a conductive material.

Additionally, in the aforementioned method, the method to seal the second cavity comprises:
forming a second assistant substrate;
forming a second bonding layer on the second assistant substrate; and
bonding the second bonding layer with the fourth dielectric layer to seal the second cavity.

Additionally, in the aforementioned method, the method to seal the second cavity comprises:
filling the second cavity with a second sacrificial material layer;
forming a second cover layer to cover the fourth dielectric layer and the second sacrificial material layer;
forming at least one second release hole in the second cover layer to expose the second sacrificial material layer;
removing the second sacrificial material layer through the second release hole; and
filling the second release hole with a second filling material to seal the second cavity.

This summary shows that the FBAR of the inventive concept comprises a continuous acoustic resonance film that completely separates the first and the second cavities. There is no through-hole in the acoustic resonance film, therefore such the FBAR, and the semiconductor apparatus comprising such an FBAR, can offer better resonance performance.

Further details of the inventive concept and the embodiments are described below with reference to the attached drawing figures.

BRIEF DESCRIPTION OF THE DRAWINGS

FIGS. 3A, 3B1, 3C, 3D, 3E, 3F1, 3G, 3H, 3I, 3J, 3K, 3L, 3M, 3N, 3O1, 3P, 3Q, 3R, and 3S1 show schematic diagrams (e.g., schematic cross-sectional views) that illustrate elements and/or structures formed in a method for manufacturing a semiconductor apparatus in accordance with one or more embodiments of the inventive concept.

FIGS. 3B2, 3F2, 3O2, 3S2, and 3S3 show the plan views of the first or the second cavity in a method for manufacturing a semiconductor apparatus in accordance with one or more embodiments of the inventive concept.

DETAILED DESCRIPTION

Figure 1:
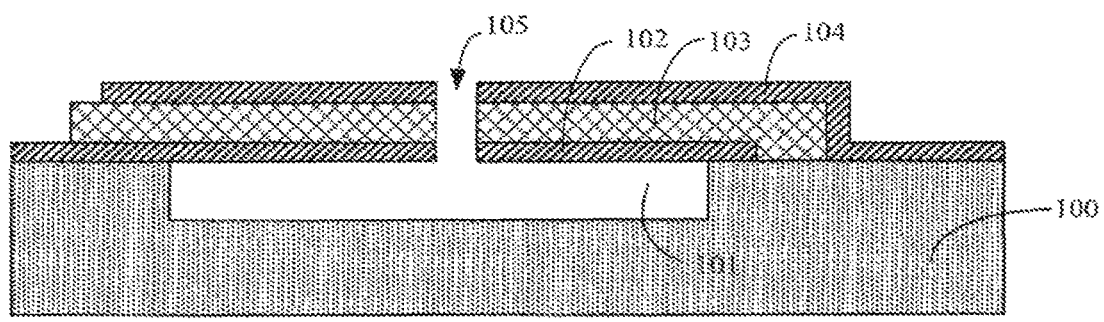
FIG. 1 (Prior Art) shows a schematic diagram (e.g., a schematic cross-sectional view) that illustrates an FBAR in prior art.

Example embodiments of the inventive concept are described with reference to the accompanying drawings. As those skilled in the art would realize, the described embodiments may be modified in various different ways, all without departing from the spirit or scope of the inventive concept. Embodiments disclosed herein may be practiced without some or all of these specified details. Well known process steps and/or structures will not be described in detail in order to avoid obscuring the inventive concept.

The drawings and description are illustrative and not restrictive. Like reference numerals may designate like (e.g., analogous or identical) elements in the specification. Repetitive description may be avoided.

Relative sizes and thicknesses of elements shown in the drawings are to facilitate the description and understanding of the inventive concept without limiting the scope of the inventive concept. In the drawings, thicknesses of some layers, films, panels, regions, etc., may be exaggerated for clarity.

Illustrations of example embodiments in the figures may represent idealized illustrations. Variations from the shapes depicted in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first," "second," etc. may be used herein to describe various elements, these elements should not be limited by these terms. These terms may be used to distinguish one element from another element. Thus, a first element discussed below may be termed a second element without departing from the teachings of the inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein should be interpreted accordingly.

The terminology used herein is for the purpose of describing particular embodiments and is not intended to limit the inventive concept. As used herein, the singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one having ordinary skill in the art related to this inventive concept. Terms, such as those defined in commonly used dictionaries, should be interpreted as having meanings that are consistent with their meanings in the context of the relevant art and should not be interpreted in an idealized or overly formal sense unless expressly so defined therein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

A First Embodiment

Figure 2A:
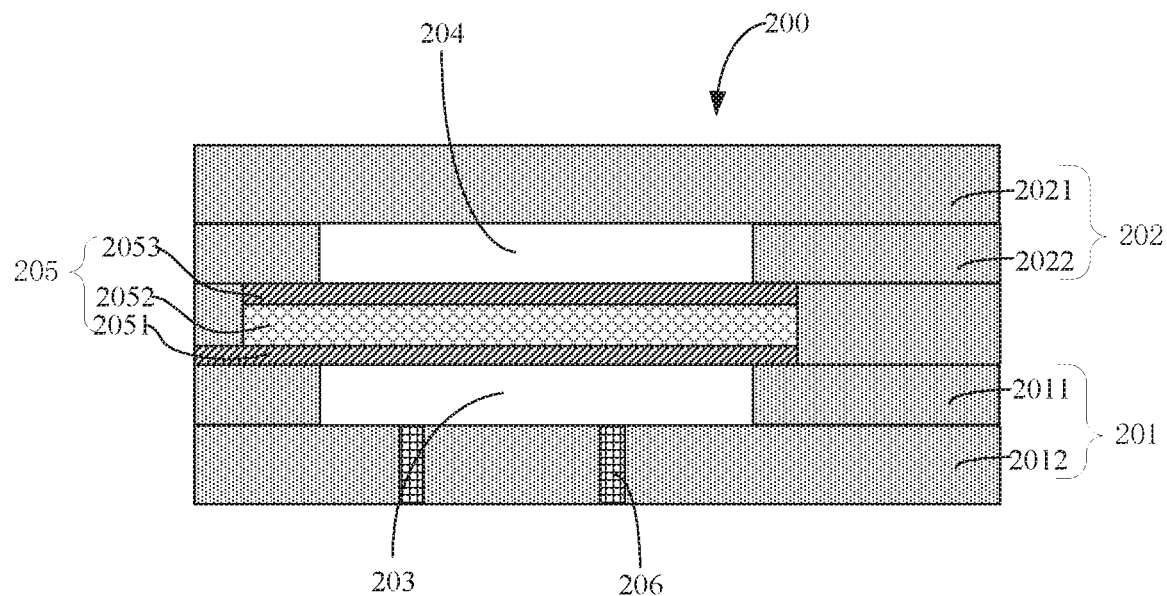
FIG. 2A shows a schematic diagram (e.g., a schematic cross-sectional view) that illustrates an FBAR in accordance with one of the embodiments of the inventive concept.
Figure 2B:
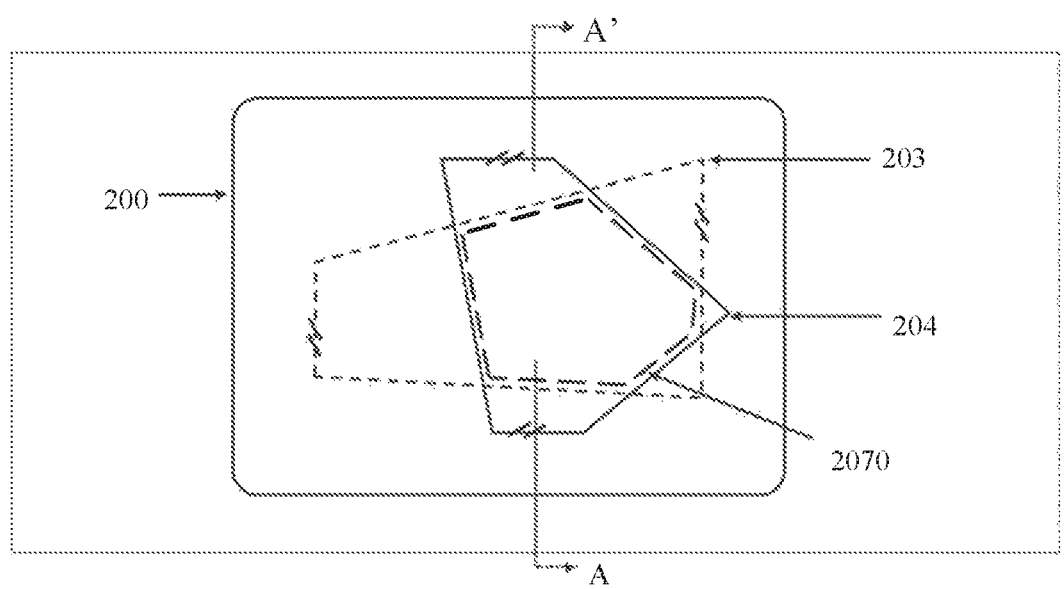
FIG. 2B shows a plan view of the first and the second cavities in FIG. 2A.

FIGS. 2A and 2B illustrate an FBAR device in accordance with one of the embodiments of the present disclosure. FIG. 2A shows a schematic cross-sectional view of such an FBAR device; FIG. 2B shows a plan view of FIG. 2A.

As illustrated in FIG. 2A, the FBAR device 200 may include the following elements: a lower dielectric layer 201, wherein there is a first cavity 203 inside the lower dielectric layer 201. As illustrated in FIG. 2B, the plan view of the first cavity 203 is a first polygon 2030, the first polygon 2030 has at least one pair of parallel sides to facilitate the measurement and control during the micro-fabrication process. The first cavity 203 may have exactly same profiles in thickness direction.

The plan view in FIG. 2B is obtained by observing the corresponding element in the schematic diagram of FIG. 2A in a thickness direction from the "top" of FIG. 2A. In this application, the "plan view" of an element in a schematic diagram refers to the view obtained by observing that element in thickness direction from the top.

The lower dielectric layer 201 may comprise multiple dielectric layers. For example, it may comprise a first dielectric layer 2011 and a second dielectric layer 2012. The second dielectric layer 2012 is on the first dielectric layer 2011. The first cavity 203 is inside the second dielectric layer 2012 and is sealed by the first dielectric layer 2011 at one end.

One or more first release hole can be formed on a portion of the first dielectric layer 2011 that is facing the first cavity 203. The first release hole may be filled with a sealing material 206. The number of the first release hole can be determined based on the requirements in the manufacturing process, the number may be, for example, one, two, or three.

The lower dielectric layer 201 can be made of materials including, but not limited to, silicon-based oxide or nitride, such as silicon dioxide ($SiO_2$), carbon-fluorine compound (CF), carbon-doped silicon oxide (SiOC), silicon nitride (SiN), or silicon carbonitride (SiCN). Alternatively, the lower dielectric layer 201 may also be made of carbon-fluorine compounds comprising silicon carbonitride (SiCN) film. The major components of the carbon-fluorine compound are fluorine (F) and carbon (C). The carbon-fluorine compounds can also be made of non-crystalline materials.

The sealing material 206 can be any sealing material that is well known to a person having ordinary skill in the art in this field. For example, it can be silicon dioxide ($SiO_2$). The sealing material 206 may also be the same material that has been used for any aforementioned dielectric layer.

The FBAR of the inventive concept may further comprise an upper dielectric layer 202, wherein there is a second cavity 204 inside the upper dielectric layer 202, the second cavity 204 is facing the first cavity 203.

In one embodiment, the upper dielectric layer 202 is on the lower dielectric layer 201. The upper dielectric layer 202 may comprise multiple dielectric layers. For example, it may comprise a third dielectric layer 2021 and a fourth dielectric layer 2022, wherein the fourth dielectric layer 2022 is on the third dielectric layer 2021. The second cavity 204 is inside the third dielectric layer 2021 and is sealed by the fourth dielectric layer 2022 at one end.

The upper dielectric layer 202 and the lower dielectric layer 201 may be made of the same material. For example, they may both be made of silicon oxide. The upper dielectric layer 202 and the lower dielectric layer 201 may also be made of different dielectric materials.

One or more second release hole (not shown) may be formed on a portion of the upper dielectric layer 202 that is on the second cavity 204. The second release hole may be filled with the sealing material 206.

As illustrated in FIG. 2B, the plan view of the second cavity 204 is a second polygon 2040, the second polygon 2040 has at least one pair of parallel sides to facilitate the measurement and control during the micro-fabrication process. The second cavity 204 may have exactly same profiles in thickness direction.

In one embodiment, the first cavity 203 is facing the second cavity 204, the plan views of the first cavity 203 and the second cavity 204 are the first polygon 2030 and the second polygon 2040, respectively, as shown in FIG. 2B. Each of the two polygons can be any polygon. For example, it can be a quadrilateral, a pentagon, or a hexagon. The plan views of the first and the second cavities will have an overlapped region, which forms a third polygon 2070, the third polygon 2070 may be any polygon. For example, it can be a quadrilateral, a pentagon, a hexagon, a heptagon, or an octagon. The third polygon 2070 does not have any parallel sides.

In one embodiment, the FBAR of the inventive concept may further comprise an acoustic resonance film 205 that is placed between the first cavity 203 and the second cavity 204. The acoustic resonance film 205 continuously separates the first cavity 203 and the second cavity 204. Part of the acoustic resonance film 205 is directly coupled with the lower dielectric layer 201 or the upper dielectric layer 202, sealing the first cavity 203 and the second cavity 204, respectively. The acoustic resonance film 205 is a continuous film without any through-hole or filling material that may disrupt its integrity.

The acoustic resonance film 205 may comprise a lower electrode layer 2051, a piezoelectric film 2052, and an upper electrode layer 2053, wherein the piezoelectric film 2052 is sandwiched by the lower electrode layer 2051 and the upper electrode layer 2053.

The piezoelectric film 2052 may be made of piezoelectric materials with wurtzite crystal structure, such as zinc oxide (ZnO), aluminum nitride (AlN), or gallium nitride (GaN). In this embodiment, it is made of aluminum nitride (AlN).

The thickness of the piezoelectric film 2052 may be chosen based on the target resonance frequency or wavelength, and can be optimally set at half of the target resonance wavelength.

The lower electrode layer 2051 may be made of a conductive or semiconductor material. The conductive material may be one or more metallic materials such as aluminum (Al), copper (Cu), platinum (Pt), gold (Au), iridium (Ir), osmium (Os), rhenium (Re), palladium (Pd), rhodium (Rh), or ruthenium (Ru). The conductive material may also be molybdenum (Mo) film or tungsten (W) film. The lower electrode layer 2051 may also be made of any suitable semiconductor materials such as silicon (Si), germanium (Ge), silicon-germanium (SiGe), silicon carbide (SiC), or silicon-germanium-carbon compound (e.g. SiGeC). The thickness of the lower electrode layer 2051 may be chosen based on the target resonance frequency or wavelength. For example, it may be optimally set at $1/10$ of the target resonance wavelength.

The upper electrode layer 2053 may be made of a conductive or semiconductor material. The conductive material may be one or more metallic materials such as aluminum (Al), copper (Cu), gold (Au), platinum (Pt), or copper alloys. The semiconductor material may be silicon (Si), germanium (Ge), silicon-germanium (SiGe), silicon carbide (SiC), or silicon-germanium-carbon compound (e.g. SiGeC). The thickness of the upper electrode layer 2053 may be chosen based on the target resonance frequency or wavelength. For example, it may be optimally set at $1/10$ of the target resonance wavelength.

To ensure a tight contact between the piezoelectric film 2052 and the lower electrode layer 2051, an adhesive layer (not shown) may be placed between the piezoelectric film 2052 and the lower electrode layer 2051. The adhesive layer may be made of crystals with wurtzite crystal structure. In this embodiment, the adhesive layer is made of molybdenum (Mo).

In one embodiment, an insulation layer can be placed between the lower electrode layer 2051 and the piezoelectric film 2052. For example, the insulation layer can be placed between the lower electrode layer 2051 and the adhesive layer. Optionally, an insulation layer may also be placed between the upper electrode layer 2053 and the piezoelectric film 2052. The insulation layer may be made of silicon-based oxide or nitride, such as silicon oxide, silicon nitride, or inorganic material in silicon oxynitride. In this embodiment, the insulation layer is made of silicon oxide.

The FBAR of the inventive concept may further comprise one or more contact hole(s) (not shown) in the lower electrode layer 2051 and the upper electrode layer 2053. Two metal connecting layers (not shown)—one connects the contact hole(s) in the lower electrode layer 2051, the other connects the contact hole(s) in the upper electrode layer 2053—may be formed. These two metal connecting layers provide electrical connection to the lower electrode layer 2051 and the upper electrode layer 2053, respectively. There may be additional dielectric layer(s) above or beneath the metal connecting layers.

Additionally, one or more contact hole may be formed in both the lower dielectric 201 and the upper dielectric layer 202 to establish electrical connection to either the lower electrode layer 2051, or the upper electrode layer 2053. The contact hole may comprise a liner layer inside its inner wall and is filled with a conductive material.

As described above, the FBAR of the inventive concept comprises a continuous acoustic resonance film 205 that completely separates the first cavity 203 and the second cavity 204. As there is no through-hole in the acoustic resonance film 205, the FBAR can offer better resonance performance.

A Second Embodiment

Figure 3C:
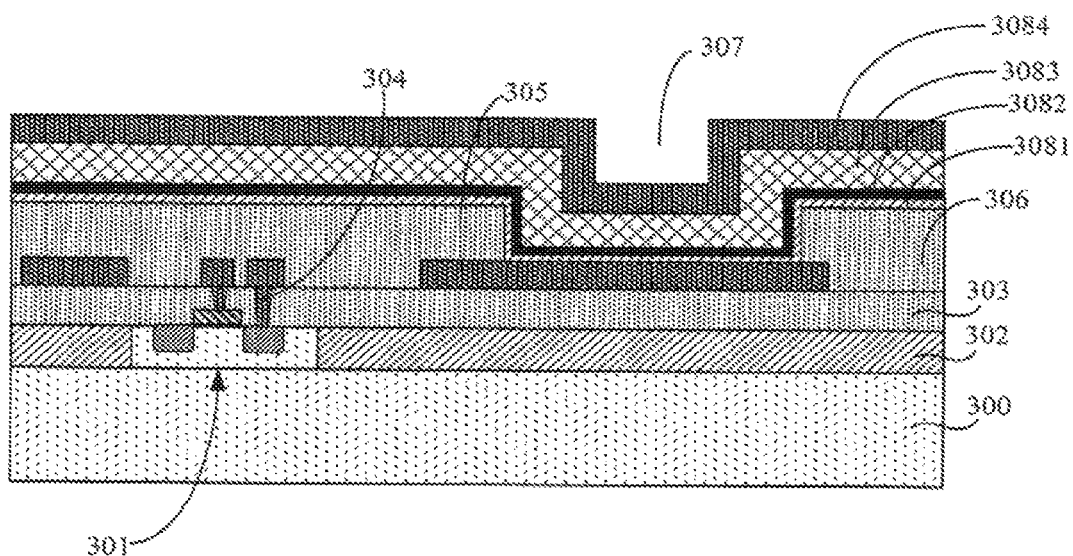
Figure 3D:
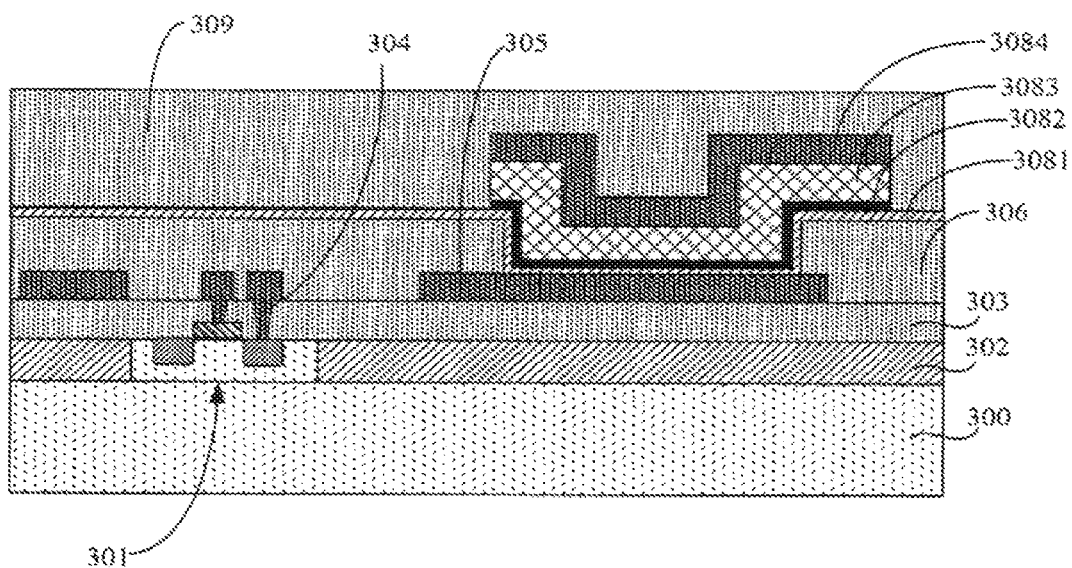
Figure 3E:
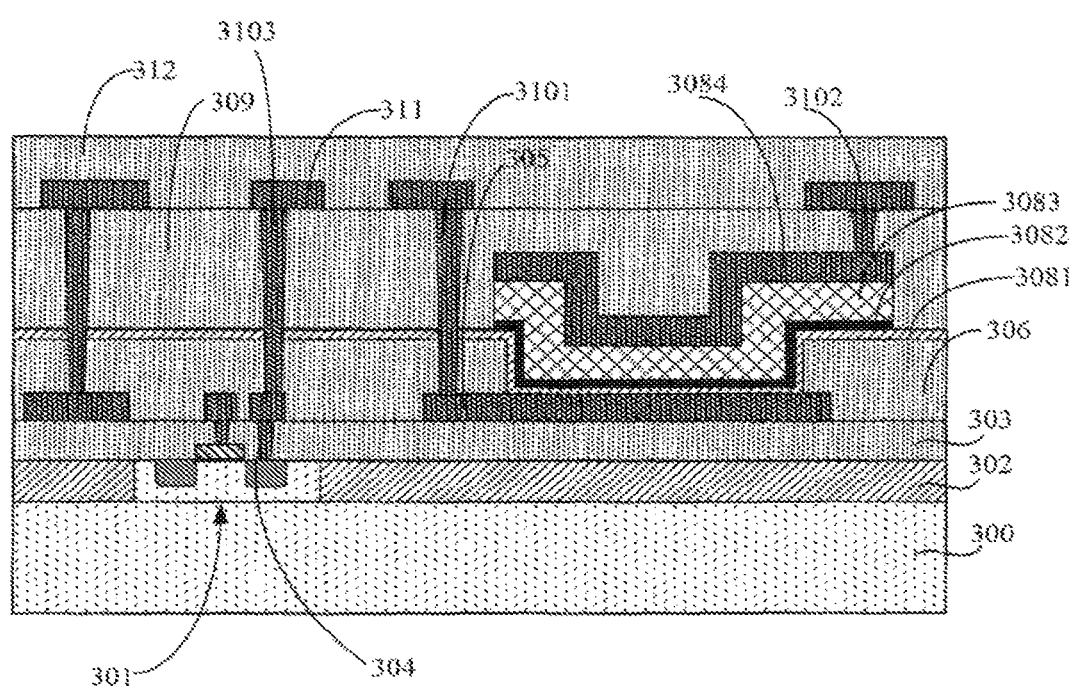
Figure 3G:
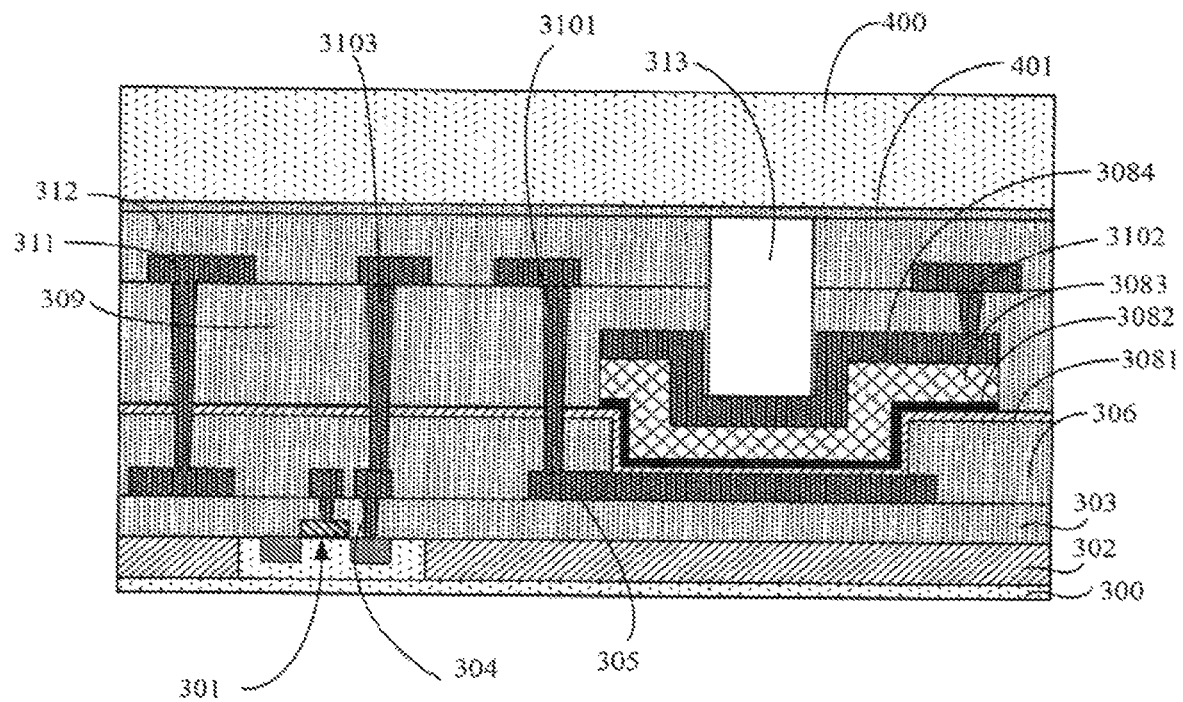
Figure 3H:
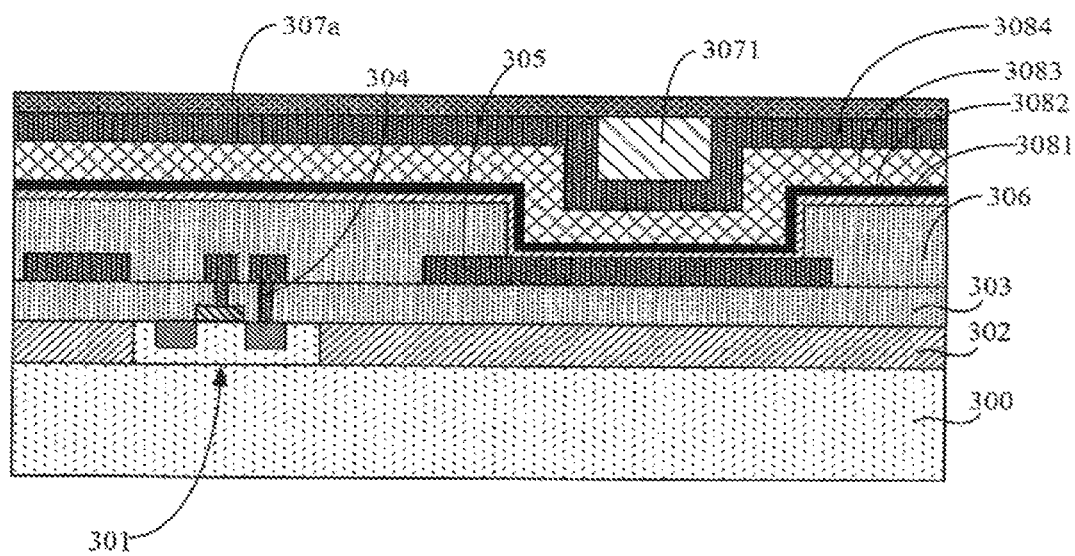
Figure 3I:
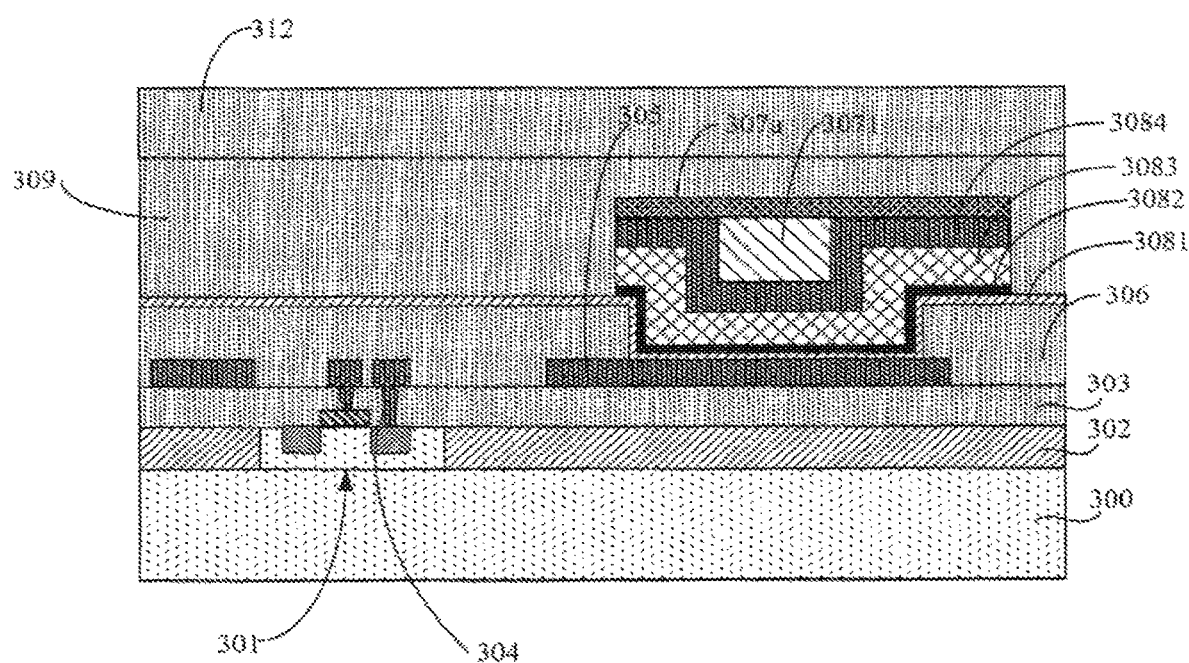
Figure 3J:
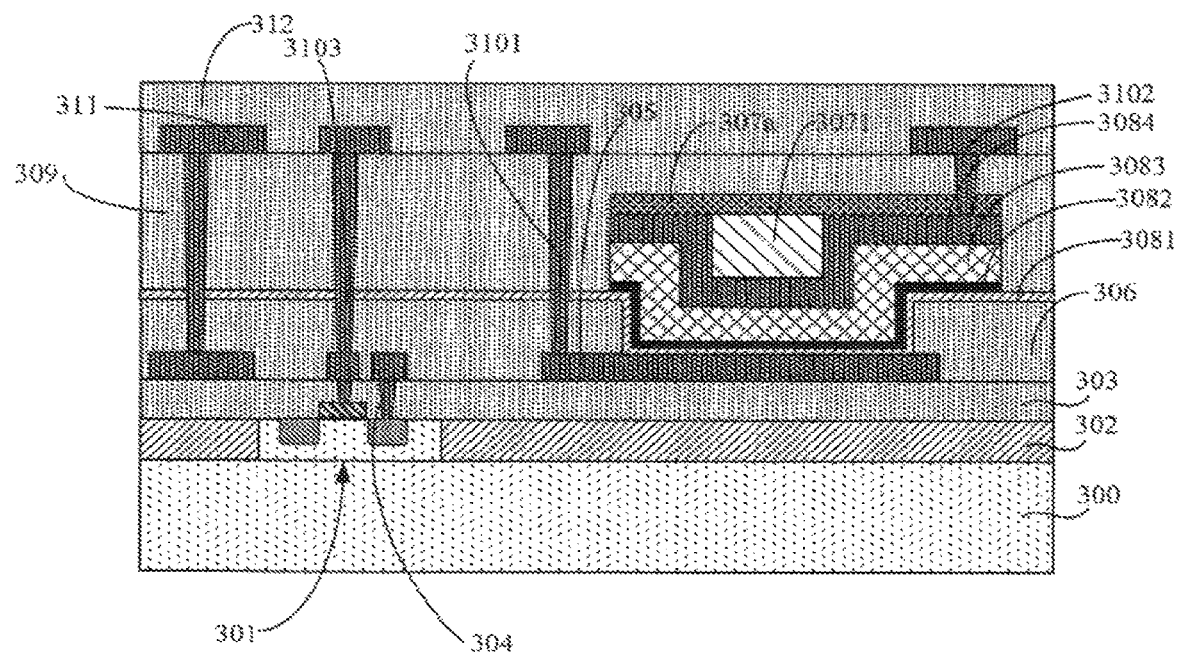
Figure 3K:
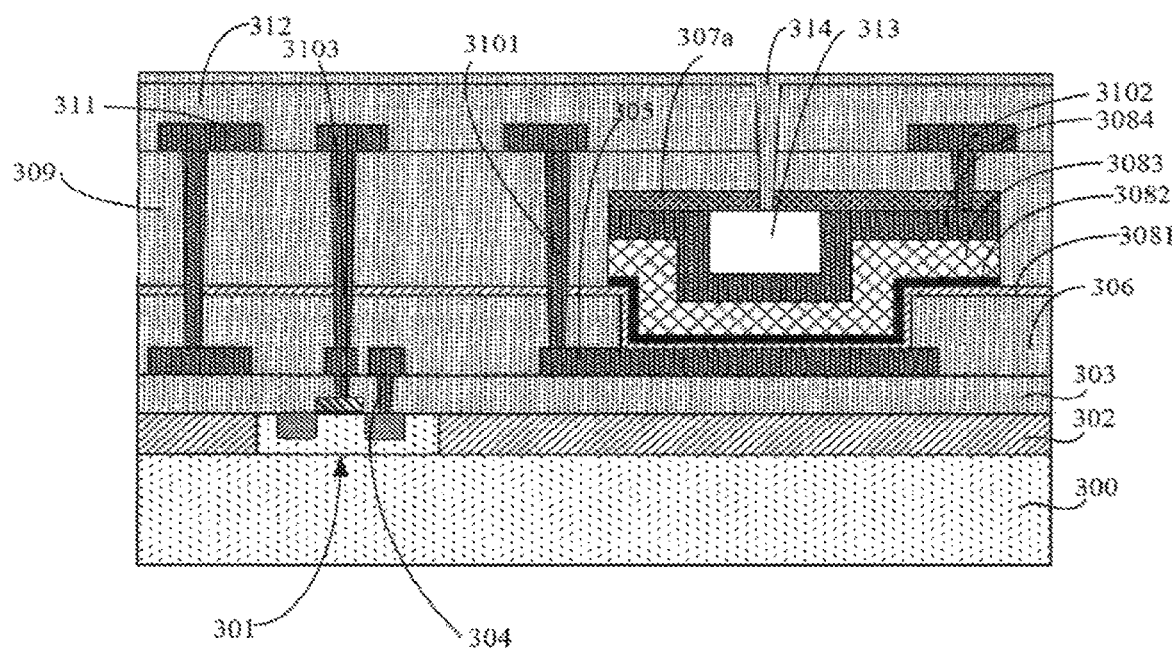
Figure 3L:
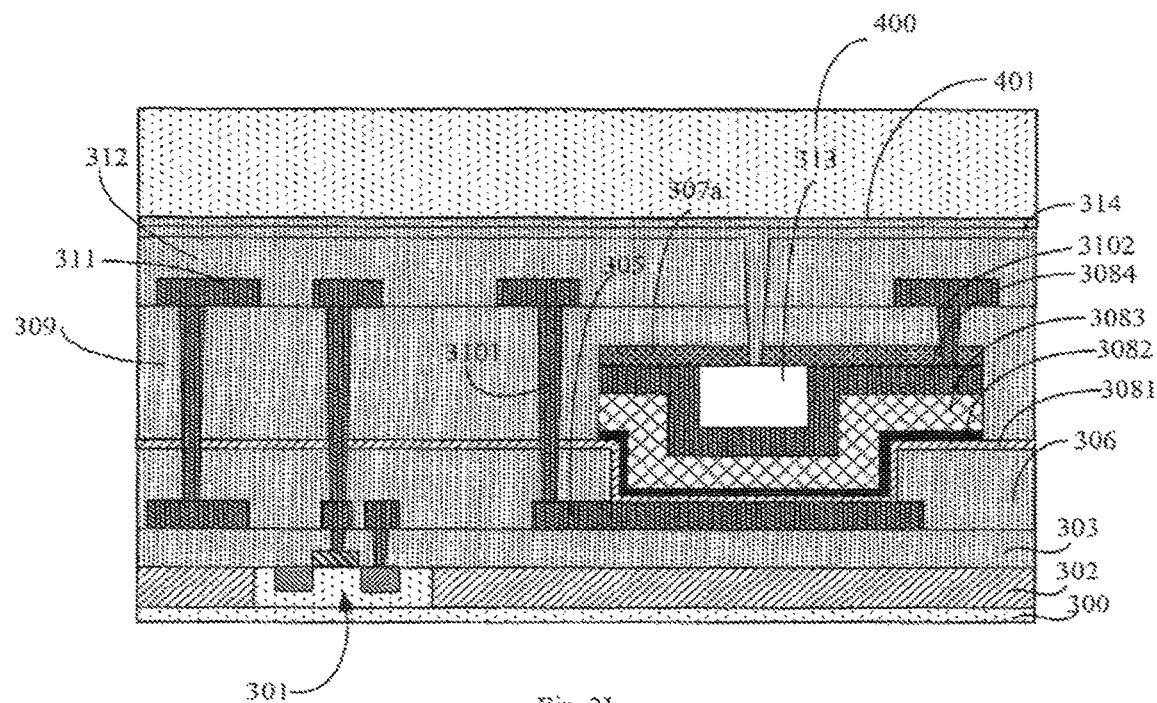
Figure 3M:
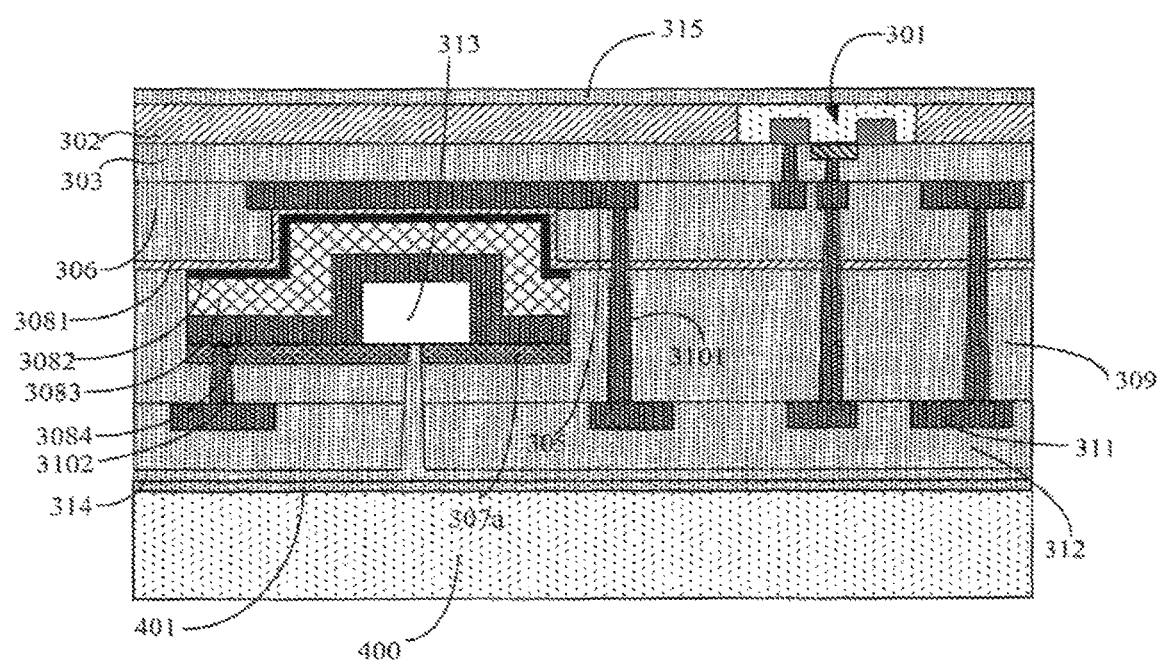
Figure 3N:
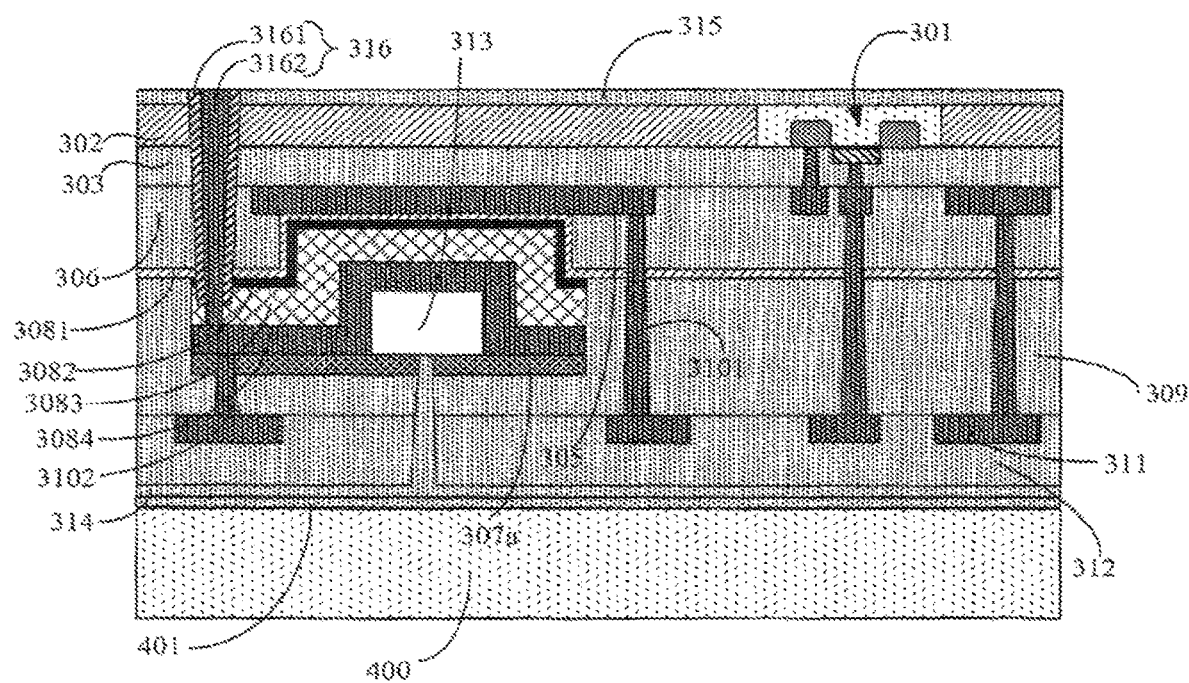
Figure 3P:
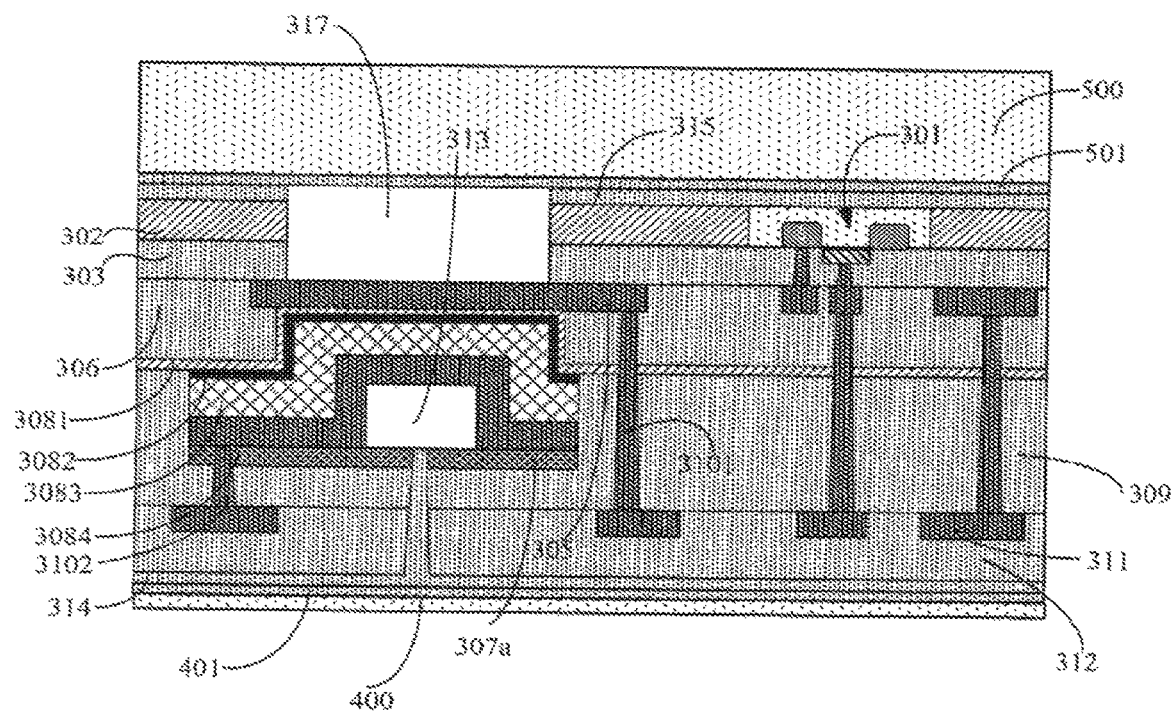
Figure 3Q:
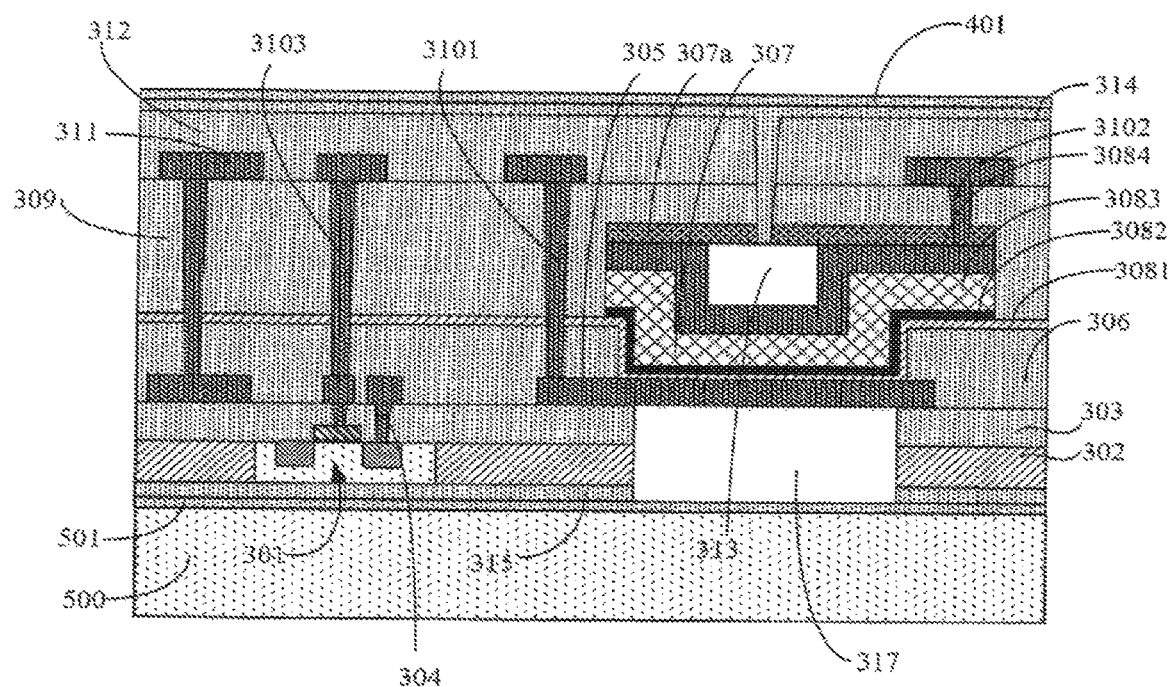

Referring to FIG. 3Q and FIG. 3S1, one embodiment of the semiconductor apparatus in this inventive concept is presented.

Referring to FIG. 3Q, as an example, the semiconductor apparatus of the inventive concept may include an isolation trench layer 302 and a first dielectric layer 303 on the isolation trench layer 302. The isolation trench layer 302 may be filled with a filling material such as silicon-based oxide, nitride, or oxynitride.

The first dielectric layer 303 may be made of materials such as silicon-based oxide or nitride. For example, the material can be silicon dioxide ($SiO_2$), carbon-fluorine compound (CF), carbon-doped silicon oxide (SiOC), silicon nitride (SiN), or silicon carbonitride (SiCN). Alternatively, the first dielectric layer 303 may also be made of carbon-fluorine compounds comprising silicon carbonitride (SiCN) film. The major components of the carbon-fluorine compound are fluorine (F) and carbon (C). The carbon-fluorine compounds may also be made of non-crystalline materials.

Referring to FIG. 3Q, a lower electrode layer 305 may be formed on the first dielectric layer 303. The lower electrode layer 305 is also on the isolation trench layer 302.

The lower electrode layer 305 may be made of conductive or semiconductor material. The conductive material may be one or more metallic materials such as aluminum (Al), copper (Cu), platinum (Pt), gold (Au), iridium (Ir), osmium (Os), rhenium (Re), palladium (Pd), rhodium (Rh), or ruthenium (Ru). The conductive material may also be molybdenum (Mo) film or tungsten (W) film. The lower electrode layer 305 may also be made of any suitable semiconductor material such as silicon (Si), germanium (Ge), silicon-germanium (SiGe), silicon carbide (SiC), or silicon-germanium-carbon compound (e.g. SiGeC).

The thickness of the lower electrode layer 305 may be chosen based on the target resonance frequency or wavelength. For example, it may be set at $1/10$ of the target resonance wavelength.

In one embodiment, a front-end device 301 may be formed in the isolation trench layer 302, the front-end device 301 is formed before the first dielectric layer 303 is formed and is covered by the first dielectric layer 303. Additionally, several first contact holes 304 may be formed in the first dielectric layer 303. The first contact holes 304 go through the first dielectric layer 303 to electrically connect to the front-end device 301. A first metal connecting layer may be formed on the first dielectric layer 303, the first metal connecting layer electrically connects the first contact holes 304, but it does not electrically connect to the lower electrode layer 305.

The front-end device 301 may be any semiconductor device that is well known to a person having ordinary skill in the art in this field, such as Metal-Oxide-Semiconductor (MOS) transistor, or Complementary Metal-Oxide-Semiconductor (CMOS) transistor. The front-end device 301 may also comprise the gate, source and drain terminals of the transistor. In this embodiment, several first contact holes 304 are connected to the gate, source, and drain terminals of a MOS transistor, respectively.

Referring to FIG. 3Q, a second dielectric layer 306 may be formed on the first dielectric layer 303. The second dielectric layer 306 covers the first dielectric layer 303 and the lower electrode layer 305.

As an example, a first opening 307 may be formed in the second dielectric layer 306, the first opening 307 exposes part of the lower electrode layer 305. The first opening 307 has a plan view of a polygon, which has at least one pair of parallel sides.

The second dielectric layer 306 may be made of materials such as silicon-based oxide or nitride. It may also be the same material that has been used for any aforementioned dielectric layer, or any other dielectric material that is well known to a person having ordinary skill in the art in this field.

Referring to FIG. 3Q, a piezoelectric film 3083 and an upper electrode layer 3084 may be formed, respectively, on the bottom and side of the first opening 307 and on the second dielectric layer 306. The piezoelectric film 3083 is above the lower electrode layer 305 and the second dielectric layer 306. The upper electrode layer 3084 is on the piezoelectric layer 3083.

In one embodiment, to ensure the tight contact between the piezoelectric film 3083 and the lower electrode layer 305, an adhesive layer 3082 may be formed between the piezoelectric film 3083 and the lower electrode layer 305. Additionally, a separation layer 3081 may also be formed between the adhesive layer 3082 and the lower electrode layer 305. The separation layer 3081 may further cover the second dielectric layer 306. Optionally, additional separation layers (not shown) may also be formed between the upper electrode layer 3084 and the piezoelectric film 3083, between the adhesive layer 3082 and the lower electrode layer 305, or between the upper electrode layer 3084 and the piezoelectric film 3083.

The piezoelectric film 3083 may be made of piezoelectric materials with wurtzite crystal structure, such as zinc oxide (ZnO), aluminum nitride (AlN), or gallium nitride (GaN). In this embodiment, it is made of aluminum nitride (AlN).

The thickness of the piezoelectric film 3083 may be chosen based on the target resonance frequency or wavelength and can be optimally set at half of the target resonance wavelength.

The upper electrode layer 3084 may be made of conductive or semiconductor material. The conductive material may be metallic material such as aluminum (Al), copper (Cu), gold (Au), platinum (Pt), or copper alloys. The semiconductor material may be silicon (Si), germanium (Ge), silicon-germanium (SiGe), silicon carbide (SiC), or silicon-germanium-carbon compound (e.g. SiGeC).

The thickness of the upper electrode layer 3084 may be chosen based on the target resonance frequency or wavelength. For example, it may be optimally set at $\frac{1}{10}$ of the target resonance wavelength.

The adhesive layer 3082 may be made of crystals with wurtzite crystal structure. In this embodiment, the adhesive layer 3082 is made of molybdenum (Mo).

The separation layer 3081 may be made of silicon-based oxide or nitride, such as silicon oxide, silicon nitride, or inorganic material in silicon oxynitride. In this embodiment, the separation layer 3081 is made of silicon oxide.

An acoustic resonance film of the inventive concept may comprise the lower electrode layer 305, the separation layer 3081, the adhesive layer 3082, the piezoelectric layer 3083, and the upper electrode layer 3084. The acoustic resonance film may further comprise additional films or layers to facilitate the operations of actual devices, the detail composition of the acoustic resonance film is not limited by what is shown or described herein.

Referring to FIG. 3Q, a third dielectric layer 309 may be formed to cover the upper electrode layer 3084 and the second dielectric layer 306. In one embodiment, when the separation layer 3081 is formed, the third dielectric layer 309 will also cover the separation layer 3081.

The third dielectric layer 309 may be made of any suitable dielectric material that is well known to a person having ordinary skill in the art in this field, it may also be made of the same material that has been used for any aforementioned dielectric layer.

Referring to FIGS. 3Q and 3S1, in one embodiment, a second contact hole 3101 may be formed to establish electrical connection to the lower electrode layer 305, a third contact hole 3102 may be formed to establish electrical connection to the upper electrode layer 3084. Both the second contact hole 3101 and the third contact hole 3102 go through the third dielectric layer 309. A second metal connecting layer 311 may be formed on the upper surface of the third dielectric layer 309. The second contact hole 3101 and the third contact hole 3102 are electrically connected to different portions of the second metal connecting layer 311 and not electrically connected to each other.

Further, referring to FIG. 3Q, a fourth contact hole 3103 may be formed to establish electrical connection to the front-end device 301. This electrical connection is established by electrically connecting a portion of the first metal connecting layer that is electrically connected to the first contact hole 304. The fourth contact hole 3103 also electrically connects to part of the second metal connecting layer 311.

Referring to FIGS. 3Q and 3S2, a first cavity 313 may be formed within the third dielectric layer 309, the first cavity 313 exposes at least part of the upper electrode layer 3084. The first cavity 313 has a plan view of a first polygon 3130 which may have at least one pair of parallel sides.

Referring to FIGS. 3Q and 3S1, in one embodiment, a fifth dielectric layer 312 may be formed on the third dielectric layer 309. The fifth dielectric layer 312 covers the second metal connecting layer 311 and the third dielectric layer 309.

The fifth dielectric layer 312 may be made of materials such as silicon-based oxide or nitride. It may also be made of the same material that has been used for any aforementioned dielectric layer, or any other dielectric material that is well known to a person having ordinary skill in the art in this field.

In one embodiment, the first cavity 313 may go through the fifth dielectric layer 312 and the third dielectric layer 309, respectively, to expose at least part of the upper electrode layer 3084.

Referring to FIG. 3S1, a first bonding layer 401 may be formed on a first assistant substrate 400. The first bonding layer 401 is bonded with the fifth dielectric layer 312 and seals the first cavity 313.

The first bonding layer 401 may be made of silicon oxide and bonded with the fifth dielectric layer 312 by melted bonding.

The first assistant substrate 400 works as a supportive foundation, it may be made of any semiconductor substrate materials such as silicon, alumina ceramic, quartz, or glass.

Referring to FIG. 3Q, in another embodiment, the first cavity 313 may be sealed by first forming a first cover layer 307a between the third dielectric layer 309 and the upper electrode layer 3084, the first cover layer 307a seals the first cavity 313. At least one first release hole may be formed, the first release hole goes through the first cover layer 307a, the third dielectric layer 309 and the fifth dielectric layer 312, respectively. The first release hole is filled with a first sealing material, the first sealing material also forms a first sealing layer 314 on the fifth dielectric layer 312.

The first cover layer 307a may be made of one of many dielectric materials including, but not limited to, silicon-based oxide, nitride, or oxynitride. For example, it may be made of silicon oxide, silicon nitride, silicon carbide, or silicon oxynitride.

The first sealing material may be any sealing material that is well known to a person having ordinary skill in the art in this field, such as silicon dioxide. The first sealing material may also be the same material that has been used for any aforementioned dielectric layer.

Optionally, additional films or layers may also be formed between the first bonding layer 401 and the fifth dielectric layer 312. Referring to FIG. 3S1, the first sealing layer 314 is an example of such additional films or layers. It is formed between the first bonding layer 401 and the fifth dielectric layer 312. The first bonding layer 401 is bonded with the first sealing layer 314, which secures the first assistant substrate 400 to the first sealing layer 314.

Additionally, referring to FIG. 3Q, a fourth dielectric layer 315 may be formed on a side of the isolation trench layer 302 that is opposing the side that contacts the first dielectric layer 303, such that the isolation trench layer 302 is positioned between the fourth dielectric layer 315 and the first dielectric layer 303.

The fourth dielectric layer 315 may be made of the same material that has been used for any aforementioned dielectric layer, or any suitable dielectric material that is well known to a person having ordinary skill in the art in this field, such as silicon oxide or silicon nitride.

Referring to FIGS. 3Q and 3S3, in one embodiment, a second cavity 317 may be formed. The second cavity 317 goes through the fourth dielectric layer 315, the isolation trench layer 302, and the first dielectric layer 303, respectively, and exposes at least part of the lower electrode layer 305. The second cavity 317 is facing the first cavity 313. The second cavity 317 has a plan view of a second polygon 3170, which may have at least one pair of parallel sides.

Referring to FIG. 3N, in one embodiment, a contact hole 316 may be formed to go through the fourth dielectric layer 315, the isolation trench layer 302, the first dielectric layer 303, and the piezoelectric film 3083, respectively, to electrically connect to the upper electrode layer 3084. The contact hole 316 may further comprise a liner layer 3161 inside its inner wall and is filled with a conductive material 3162.

The liner layer 3161 may be made of any of the liner materials including, but not limited to, silicon-based oxide or nitride. Optimally, the liner layer 3161 may be made of the silicon nitride. The methods to form the liner layer 3161 include, but not limited to, Chemical Vapor Deposition or Physical Vapor Deposition. The thickness of the liner layer 3161 may range from 200 to 1000 nanometer.

The conductive material 3162 may be any conductive material that is well known to a person having ordinary skill in the art in this field including but not limited to metallic materials such as aluminum (Al), copper (Cu), or tungsten (W). The filling conductive material 3162 may also be a doped semiconductor material such as doped poly-silicon.

When additional layers are formed between the piezoelectric film 3083 and the lower electrode layer 305, the contact hole 316 will also go through those additional layers. For example, referring to FIG. 3N, when the separation layer 3081 and the adhesive layer 3082 are formed between the piezoelectric film 3083 and the lower electrode layer 305, the contact hole 316 will also go through the separation layer 3081 and the adhesive layer 3082.

The liner layer 3161 can prevent accidental electrical connection between the filling conductive material 3162 in the contact hole 316 and the conductive materials that are not in the upper electrode layer 3084. The liner layer 3161 may also be formed only in a portion of the contact hole 316 that is inside the piezoelectric film 3083.

To facilitate establishing connection to the aforementioned contact holes, the lower electrode layer 305 will not completely overlap with the piezoelectric film 3083 and the upper electrode layer 3084 when viewed in the thickness direction, Referring to FIG. 3Q, in one embodiment, a second bonding layer 501 may be formed on a second assistant substrate 500. The second bonding layer 501 then is bonded with the fourth dielectric layer 315 to seal the second cavity 317.

The second bonding layer 501 may be made of silicon oxide and bonded with the fourth dielectric layer 315 by melted bonding.

The second assistant substrate 500 works as a supportive foundation, and may be made of any semiconductor substrate materials such as silicon, alumina ceramic, quartz, or glass.

Referring to FIG. 3S1, in another embodiment, the second cavity 317 may also be sealed by first forming a second cover layer 317a on the fourth dielectric layer 315, the second cover layer 317a seals the second cavity 317. At least one second release hole may be formed, the second release hole goes through the second cover layer 317a and is filled with a second sealing material. The second sealing material also forms a second sealing layer 321.

The second cover layer 317a may be made of one of many dielectric materials, including, but not limited to, silicon-based oxide, nitride, or oxynitride, For example, it may be made of silicon oxide, silicon nitride, silicon carbide, or silicon oxynitride.

Figure 3R:
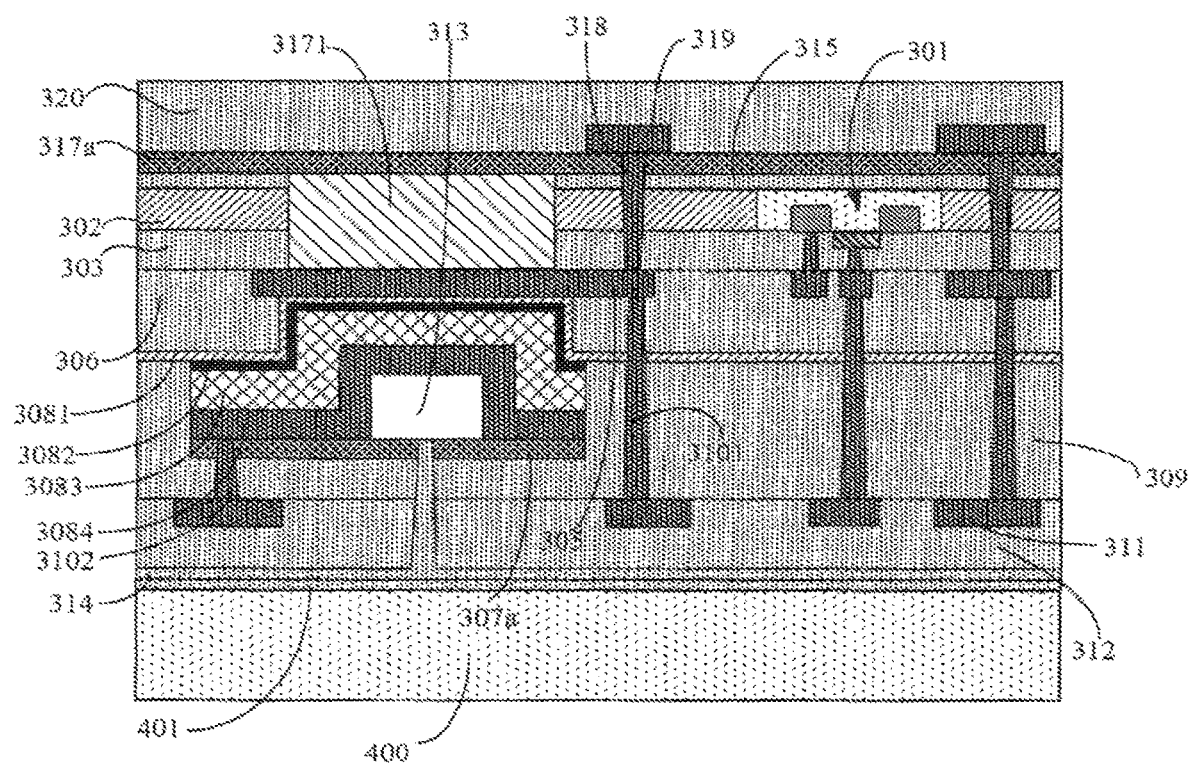

Referring to FIGS. 3R and 3S1, a third metal connecting layer 319 may be formed on the second cover layer 317a. A fifth contact hole 318 may be formed underneath the third metal connecting layer 319. The fifth contact hole 318 goes through the second cover layer 317a, the fourth dielectric layer 315, the isolation trench layer 302, and the first dielectric layer 303 to electrically connect to the lower electrode layer 305.

A sixth dielectric layer 320 may be formed to cover the second cover layer 317a and the third metal connecting layer 319. Referring to FIG. 3S1, the second release hole may further go through the sixth dielectric layer 320, the second sealing material may fill the second release hole and further cover the six dielectric layer 320 to form the second sealing layer 321.

The sixth dielectric layer 320 may be made of the same material that has been used for any aforementioned dielectric layer, or any suitable dielectric material that is well known to a person having ordinary skill in the art in this field, such as silicon oxide or silicon nitride.

Both the first assistant substrate 400 and the second assistant substrate 500 are optional. Their sizes depend on the size of the device and the requirements of the fabrication process.

Referring to FIGS. 3S2 and 3S3, the plan views of the first cavity 313 and the second cavity 317 are a first polygon 3130 and a second polygon 3170, respectively. The first polygon 3130 and the second polygon 3170 can be any polygon. For example, it can be a quadrilateral, a pentagon, or a hexagon. Referring to FIG. 2B, the plan views of the first and the second cavities have an overlapped region, which has the shape of a third polygon 2070 depicted in FIG. 2B. The third polygon 2070 may be any polygon. For example, it may be a quadrilateral, a pentagon, a hexagon, a heptagon, or an octagon. The third polygon 2070 does not have any parallel sides. This design can reduce, if not eliminate, the interfering horizontal acoustic resonance that may otherwise originate from, and be reinforced by, the acoustic resonance film.

The FBAR of the present disclosure includes the dielectric layers, the lower electrode layer 305, the piezoelectric film 3083, the adhesive layer 3082, the first cavity 313, and the second cavity 317.

As described above, the semiconductor apparatus of the present disclosure includes an FBAR, which in turn includes a continuous acoustic resonance film. This acoustic resonance film completely separates the first cavity 313 from the second cavity 317. There is no through-hole in the acoustic resonance film. Therefore, the FBAR, and the semiconductor apparatus comprising such an FBAR, can offer better acoustic resonance performance.

Figure 4:
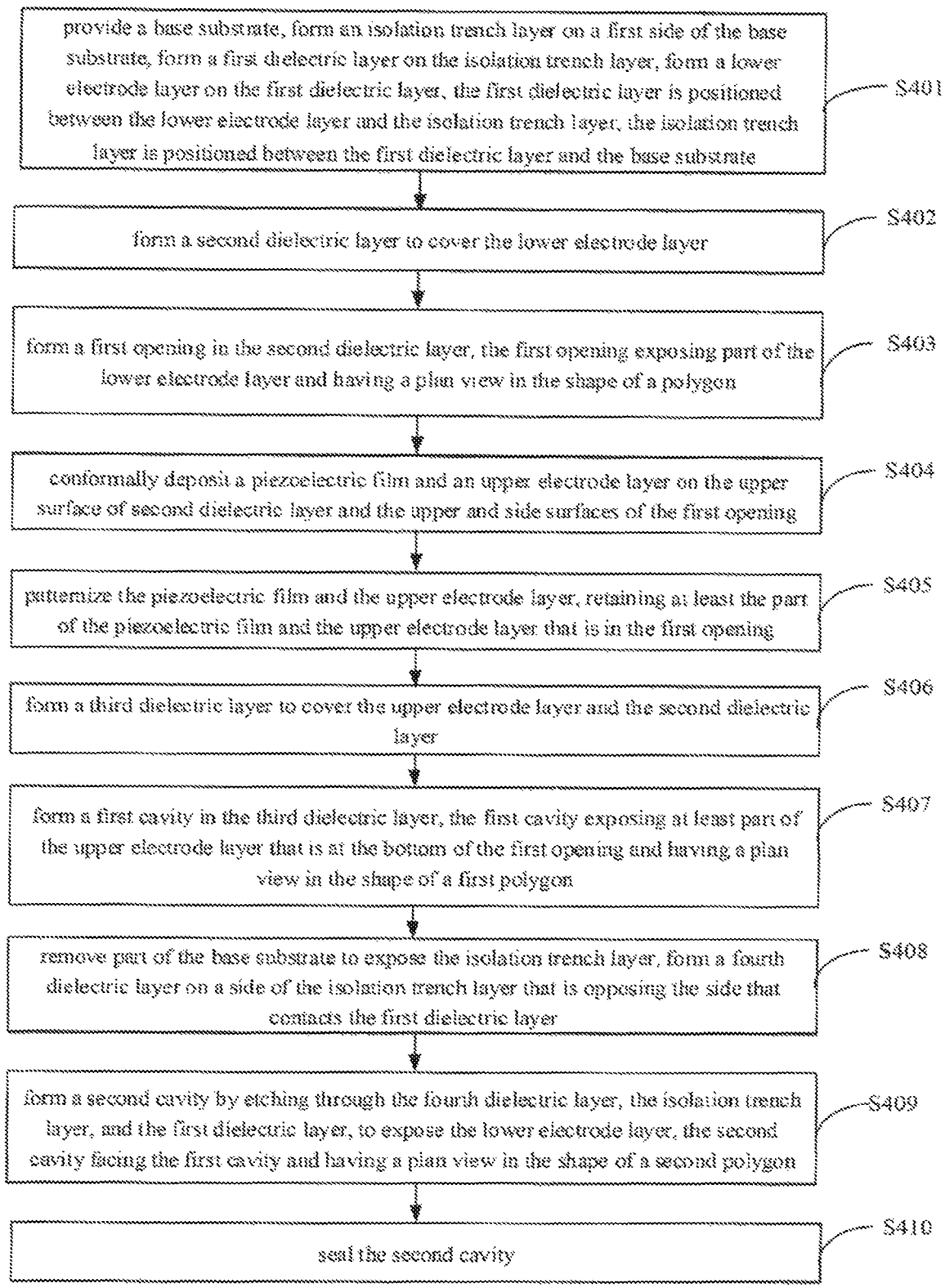
FIG. 4 shows a flow char that illustrates a method for manufacturing a semiconductor apparatus in accordance with one or more embodiments of the inventive concept.

FIG. 4 depicts a manufacturing method for the semiconductor apparatus in accordance with the inventive concept. This manufacturing method comprises the following major steps:

In S401, provide a base substrate, form an isolation trench layer on a first side of the base substrate, form a first dielectric layer on the isolation trench layer, form a lower electrode layer on the first dielectric layer, the first dielectric layer is positioned between the lower electrode layer and the isolation trench layer, the isolation trench layer is positioned between the first dielectric layer and the base substrate.

In S402, form a second dielectric layer to cover the lower electrode layer.

In S403, form a first opening in the second dielectric layer, the first opening exposing part of the lower electrode layer and having a plan view in the shape of a polygon.

In S404, conformally deposit a piezoelectric film and an upper electrode layer on the upper surface of second dielectric layer and the upper and side surfaces of the first opening.

In S405, patternize the piezoelectric film and the upper electrode layer, retaining at least the part of the piezoelectric film and the upper electrode layer that is in the first opening.

In S406, form a third dielectric layer to cover the upper electrode layer and the second dielectric layer.

In S407, form a first cavity in the third dielectric layer, the first cavity exposing at least part of the upper electrode layer that is at the bottom of the first opening and having a plan view in the shape of a first polygon.

In S408, remove part of the base substrate to expose the isolation trench layer, form a fourth dielectric layer on a side of the isolation trench layer that is opposing the side that contacts the first dielectric layer.

In S409, form a second cavity by etching through the fourth dielectric layer, the isolation trench layer, and the first dielectric layer, to expose the lower electrode layer, the second cavity facing the first cavity and having a plan view in the shape of a second polygon.

In S410, seal the second cavity.

An acoustic resonance film in the present disclosure may comprise the lower electrode layer, the piezoelectric film, and the upper electrode layer. The plan views of the first and the second cavities have an overlapped region, which has an outline in the shape of a third polygon that does not have any parallel sides.

The FBAR of the present disclosure comprises a continuous acoustic resonance film that completely separates the first and the second cavities. There is no through-hole that extends through the acoustic resonance film. Therefore, the FBAR offers better acoustic resonance performance, which in turn improves the performance of the semiconductor apparatus comprising such an FBAR. In addition, the manufacturing method of the FBAR can be integrated into existing CMOS fabrication processes.

A Third Embodiment

Referring to FIGS. 3A, 3B1, 3B2, 3C, 3D, 3E, 3F1, 3F2, 3G, 3H, 3I, 3J, 3K, 3L, 3M, 3N, 3O1, 3O2, 3P, 3Q, 3R, 3S1, 3S2, and 3S3, one embodiment of a manufacturing method for a semiconductor apparatus of the inventive concept is described. FIGS. 3A, 3B1, 3C, 3D, 3E, 3F1, 3G, 3H, 3I, 3J, 3K, 3L, 3M, 3N, 3O1, 3P, 3Q, 3R, and 3S1 show the cross-sectional views that illustrate elements and/or structures formed in accordance with one or more embodiments of the manufacturing method. FIGS. 3B2, 3F2, 3O2, 3S2, and 3S3 show the plan views of the first or the second cavity in a method for manufacturing a semiconductor apparatus in accordance with one or more embodiments of the inventive concept. The major steps of this manufacturing method are described below.

Referring to FIG. 3A, a base substrate 300 is provided, and an isolation trench layer 302 is formed on a first side of the base substrate 300. A first dielectric layer 303 is formed above the base substrate 300 such that it covers the isolation trench layer 302, the isolation trench layer 302 is positioned between the base substrate 300 and the first dielectric layer 303. A lower electrode layer 305 is formed on the first dielectric layer 303. The lower electrode layer 305 is also above the isolation trench layer 302.

The base substrate 300 may be a silicon-based substrate, it may be made of silicon (Si), germanium (Ge), silicon-germanium (SiGe), silicon carbide (SiC), silicon-germanium-carbon compound (e.g. SiGeC), indium arsenide (InAs), gallium arsenide (GaAs), indium phosphide (InP), other III-V group semiconductor materials, or a semiconductor multi-layer structure comprising of these semiconductor materials. The base substrate 300 may also be made of silicon-on-insulator (SOI), silicon-on-silicon-on-insulator (SSOI), silicon-on-silicon-germanium-on-insulator (S—SiGeOI), silicon-germanium-on-insulator (SiGeOI), or germanium-on-insulator (GeOI). It may also be made of other materials that can work as a supportive foundation, such as alumina ceramic, quartz, or glass.

The isolation trench layer 302 may be formed by any process that is well known to a person having ordinary skill in the art in this field, such as photo-lithography, etching, or deposition. A filling material, such as silicon-based oxide or nitride, may be used to fill the isolation trench layer 302.

The first dielectric layer 303 may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the first dielectric layer 303 may also be made of carbon-fluorine compounds comprising silicon carbonitride (SiCN) film. The major components of the carbon-fluorine compound are fluorine (F) and carbon (C). The carbon-fluorine compounds may also be made of non-crystalline materials.

The first dielectric layer 303 may be formed by any deposition process that is well known to a person having ordinary skill in the art in this field. For example, it may be formed by Chemical Vapor Deposition or Physical Vapor Deposition. The Chemical Vapor Deposition may be thermal Chemical Vapor Deposition (thermal CVD) process or high density plasma (HDP) process.

The thickness of the deposition may be determined by the size of the semiconductor apparatus and is not limited here.

Referring to FIG. 3A, in one embodiment, a front-end device 301 may be formed in the isolation trench layer 302, the front-end device 301 is formed before the first dielectric layer 303 is formed and is covered by the first dielectric layer 303. Additionally, several first contact holes 304 may be formed in the first dielectric layer 303, the first contact holes 304 go through the first dielectric layer 303 to electrically connect to the front-end device 301. A first metal connecting layer may be formed on the first dielectric layer 303, some parts of the first metal connecting layer electrically connect to the first contact holes 304.

The transistor 301 may be any front-end semiconductor device that is well known to a person having ordinary skill in the art in this field. For example, it may be a Metal-Oxide-Semiconductor (MOS) transistor. For a MOS transistor, the first contact holes 304 may be connected to the gate, source, or drain terminal of the MOS transistor, respectively.

In this embodiment, a portion of the first metal connection layer may be used as a lower electrode layer 305, this portion of the first metal connecting layer is not electrically connected to the first contact holes 304. Alternatively, the lower electrode layer 305 may also be formed by deposition on the first dielectric layer 303.

The lower electrode layer 305 may be made of a conductive material. The conductive material used may be one or more metallic materials such as aluminum (Al), copper (Cu), platinum (Pt), gold (Au), iridium (Ir), osmium (Os), rhenium (Re), palladium (Pd), rhodium (Rh), or ruthenium (Ru). The conductive material may also be molybdenum (Mo) film or tungsten (W) film. The metallic materials may be deposited by Low Pressure Chemical Vapor Deposition (LPCVD), Atomic Layer Deposition (ALD), or other advanced deposition techniques.

The lower electrode layer 305 may also be made of any suitable semiconductor material such as silicon (Si), germanium (Ge), silicon-germanium (SiGe), silicon carbide (SiC), or silicon-germanium-carbon compound (e.g. SiGeC). The semiconductor material may be deposited by Low Pressure Chemical Vapor Deposition (LPCVD), Plasma Enhanced Chemical Vapor Deposition (PECVD), Ultra High Vacuum Chemical Vapor Deposition (UHVCVD), Rapid Thermal Chemical Vapor Deposition (RTCVD), or Molecular Beam Epitaxy (MBE).

The thickness of the lower electrode layer 305 may be chosen based on the target resonance frequency or wavelength. For example, it may be set at 1/10 of the target resonance wavelength.

Referring to FIG. 3A, a second dielectric layer 306 may be formed on the first dielectric layer 303, the second dielectric layer 306 covers the lower electrode layer 305. In this embodiment, the second dielectric layer 306 also covers the first metal connecting layer and the first dielectric layer 303.

The second dielectric layer 306 may be made of materials such as silicon-based oxide or nitride. For example, the material can be silicon dioxide ($SiO_2$), carbon-fluorine compound (CF), carbon-doped silicon oxide (SiOC), silicon nitride (SiN), or silicon carbonitride (SiCN). Alternatively, the second dielectric layer 306 may also be made of carbon-fluorine compounds comprising silicon carbonitride (SiCN) film. The major components of the carbon-fluorine compound are fluorine (F) and carbon (C). The carbon-fluorine compounds may also be made of non-crystalline materials.

The second dielectric layer 306 may be formed by any suitable deposition technique that is well known to a person having ordinary skill in the art in this field. For example, it can be Chemical Vapor Deposition or Physical Vapor Deposition. The Chemical Vapor Deposition may be thermal Chemical Vapor Deposition (thermal CVD) process or high density plasm (HDP) process. The second dielectric layer 306 may also be made of the same material that has been used for any aforementioned dielectric layer.

The thicknesses of the deposition may be determined by the size of the semiconductor apparatus and is not limited to what is shown or described herein.

Referring to FIGS. 3B1 and 3B2, a first opening 307 may be formed in the second dielectric layer 306, the first opening 307 exposes part of the lower electrode layer 305. The plan view of the first opening 307 is a polygon 3070, as shown in FIG. 3B2. The polygon 3070 may have at least one pair of parallel sides as shown in FIG. 3B2.

Specifically, the first opening 307 may be formed in the second dielectric layer 306 by first forming a photoresist layer on the second dielectric layer 306 to define the position and shape of the first opening 307. The photoresist layer covers to-be-retained region and may be formed by spin coating, exposure and development. Then the first opening 307 may be formed by etching a portion of the second dielectric layer 306 that is not covered by the photoresist layer until part of the lower electrode layer 305 is exposed.

The etching process used to form the first opening 307 may be a dry etching or a wet etching process. The dry etching process may be Reactive Ion Etching (RIE), ion etching, plasma etching, or laser cutting. The etching agent can be, for example, oxygen-based gas if plasma etching is used.

Referring to FIG. 3C, a piezoelectric film 3083 and an upper electrode layer 3084 may be conformally deposited, respectively, on the bottom and side of the first opening 307 and on top of the second dielectric layer 306.

In one embodiment, before the piezoelectric film 3083 is formed, a separation layer 3081 may be formed on the bottom and side of the first opening 307 and on the second dielectric layer 306.

The separation layer 3081 may be made of silicon-based oxide or nitride, such as silicon oxide, silicon nitride, or inorganic material in silicon oxynitride. In this embodiment, the separation layer 3081 is made of silicon oxide. The separation layer 3081 may be formed by any deposition method that is well known to a person having ordinary skill in the art in this field, such as Chemical Vapor Deposition or Physical Vapor Deposition.

In one embodiment, after the separation layer 3081 is formed but before the piezoelectric film 3083 is formed, an adhesive layer 3082 may be formed to cover the bottom and side surfaces of the first opening 307 and the upper surface of the second dielectric layer 306.

The adhesive layer 3082 may be made of crystals with wurtzite crystal structure. In this embodiment, it is made of molybdenum (Mo). The adhesive layer 3082 may be formed by Low Pressure Chemical Vapor Deposition (LPCVD), Plasma Enhanced Chemical Vapor Deposition (PECVD), Metal Organic Chemical Vapor Deposition (MOCVD), Atomic Layer Deposition (ALD), or other advanced deposition techniques.

The piezoelectric film 3083 may be made of piezoelectric materials with wurtzite crystal structure, such as zinc oxide (ZnO), aluminum nitride (AlN), or gallium nitride (GaN). In this embodiment, it is made of aluminum nitride (AlN). The piezoelectric film 3083 may be deposited by method such as vacuum deposition, sputtering, Chemical Vapor Deposition (CVD), or molecular beam epitaxy (MBE).

In one embodiment, when aluminum nitride (AlN) is used for the piezoelectric film 3083, the piezoelectric film 3083 may be formed by Radio Frequency (RF) magnetron sputtering. Specifically, an AlN piezoelectric film 3083 may be formed by RF magnetron sputtering at a base temperature of 200° C. in Helium and Nitrogen gas with aluminum being used as the negative terminal.

The thicknesses of the piezoelectric film 3083 may be chosen based on the target resonance frequency or wavelength. Optimally, it may be set at half of the target resonance wavelength.

The upper electrode layer 3084 may be made of conductive or semiconductor materials. The conductive materials may be metallic materials such as aluminum (Al), copper (Cu), gold (Au), platinum (Pt), or copper alloys. The semiconductor materials may be silicon (Si), germanium (Ge), silicon-germanium (SiGe), silicon carbide (SiC), or silicon-germanium-carbon compound (e.g. SiGeC).

The upper electrode layer 3084 may be formed by Low Pressure Chemical Vapor Deposition (LPCVD), Plasma Enhanced Chemical Vapor Deposition (PECVD), Metal Organic Chemical Vapor Deposition (MOCVD), Atomic Layer Deposition (ALD), or other advanced deposition techniques.

The thicknesses of the upper dielectric layer 3084 may be chosen based on the target resonance frequency or wavelength. Optimally, it may be set at 1/10 of the target resonance wavelength.

Additional separation layers (not shown) may be formed between the upper electrode layer 3084 and the piezoelectric film 3083. These separation layers may be made of silicon-based oxide or nitride, such as silicon oxide, silicon nitride, or the inorganic material in silicon oxynitride.

An acoustic resonance film of the present disclosure comprises the lower electrode layer 305, the separation layer 3081, the adhesive layer 3082, the piezoelectric film 3083, and the upper electrode layer 3084. The acoustic resonance film may further include other films to facilitate the operations of actual devices, the detail composition of the acoustic resonance film is not limited by this embodiment.

The adhesive layer 3082, the piezoelectric film 3083 and the upper electrode layer 3084 are conformally deposited in the first opening 307, but these layers do not completely fill the first opening 307. The unfilled portion of the first opening 307 has a similar plan view with that of the adhesive layer 3082, the piezoelectric film 3083, and the upper electrode layer 3084. For example, their plan views may all be polygons with at least one pair of parallel sides.

Referring to FIG. 3D, the piezoelectric film 3083 and the upper dielectric layer 3084 are patternized, and the excess material of the piezoelectric film 3083 and the upper dielectric layer 3084 that are outside of the first opening 307 is removed.

The patternization process may be performed by first forming a photoresist layer on the piezoelectric film 3083 and the upper electrode layer 3084, the photoresist layer covers to-be-retained region and may be formed by spin coating, exposure and development on the upper electrode layer 3084, then the patternization may be performed by etching a portion of piezoelectric film 3083 and the upper electrode layer 3084 that is not covered by the photoresist layer. After the patternization process, a portion of the piezoelectric film 3083 and the upper electrode layer 3084 that is on top of the first opening 307 will be retained.

The lower electrode layer 305 may not completely overlap with the piezoelectric film 3083 and the upper electrode layer 3084 when viewed in thickness direction to facilitate the manufacture of the contact holes in these layers.

The etching process used in this process may be a dry etching or a wet etching process. The dry etching process may be Reactive Ion Etching (RIE), ion etching, plasma etching, or laser cutting. The etching process may be chosen based on the layer material. For example, for metallic layer, the etching agent may be chlorine ($Cl_2$), boron trichloride ($BCl_3$), argon (Ar), nitrogen ($N_2$), trifluoromethane ($CHF_3$), or ethylene ($C_2H_4$). Chlorine ($Cl_2$) may be used as the main etching agent. In one embodiment, when there exists the separation layer 3081, the patternization process will stop upon reaching the separation layer 3081.

Referring to FIG. 3D, a third dielectric layer 309 may be formed on the first side of the base substrate 300 to cover the upper electrode layer 3084 and the second dielectric layer 306. A planarization process will be applied on the third dielectric layer 309. The third dielectric layer 309 covers the entire first side of the base substrate 300 and is deposited higher than the upper electrode layer 3084.

The third dielectric layer 309 may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the third dielectric layer 309 may also be made of carbon-fluorine compounds comprising silicon carbonitride (SiCN) film. The major components of the carbon-fluorine compound are fluorine (F) and carbon (C). The carbon-fluorine compounds may also be made of non-crystalline materials. The third dielectric layer 309 may be made of the same material that has been used for any aforementioned dielectric layer.

The third dielectric layer 309 may be formed by any deposition process that is well known to a person having ordinary skill in the art in this field. For example, it may be formed by Chemical Vapor Deposition or Physical Vapor Deposition. The Chemical Vapor Deposition may be thermal Chemical Vapor Deposition (thermal CVD) process or high density plasma (HDP) process.

The thickness of the deposition may be determined by the size of the semiconductor apparatus and is not limited to what is shown or described herein.

Further, referring to FIGS. 3F1 and 3F2, a first cavity 313 may be formed in the third dielectric layer 309. The first cavity 313 exposes at least part of the upper electrode layer 3084. The plan view of the first cavity 313 is a first polygon 3130. The first polygon 3130 may have at least one pair of parallel sides, as shown in FIG. 3F2.

The first cavity 313 will be sealed by one of the following two methods.

Referring to FIG. 3E to 3G, the first method to construct and seal the first cavity 313 comprises the following steps:

First, referring to FIG. 3E, form a second contact hole 3101 that goes through the third dielectric layer 309 and part of the second dielectric layer 306, respectively, to electrically connect to the lower electrode layer 305. Form a third contact hole 3102 that goes through a portion of the third dielectric layer 309 on the upper electrode layer 3084 to electrically connect to the upper electrode layer 3084. Form a second metal connecting layer 311 on the third dielectric layer 309. Two different portions of the second metal connecting layer 311 electrically connect to the second contact hole 3101 and the third contact hole 3102, respectively, these two portions of the second metal connecting layer 311 are not electrically connected to each other.

Second, form a fifth dielectric layer 312 on the third dielectric layer 309 to cover the third dielectric layer 309 and the second metal connecting layer 311.

The fifth dielectric layer 312 may be made of materials including, but not limited to, silicon-based oxide or nitride, such as silicon dioxide ($SiO_2$), carbon-fluorine compound (CF), carbon-doped silicon oxide (SiOC), silicon nitride (SiN), or silicon carbonitride (SiCN). Alternatively, the fifth dielectric layer 312 may also be made of carbon-fluorine compounds comprising silicon carbonitride (SiCN) film. The major components of the carbon-fluorine compound are fluorine (F) and carbon (C). The carbon-fluorine compounds can also be made of non-crystalline materials. The fifth dielectric layer 312 may also be made of the same material that has been used for any aforementioned dielectric layer.

The fifth dielectric layer 312 may be formed by any deposition process that is well known to a person having ordinary skill in the art in this field. For example, it may be formed by Chemical Vapor Deposition or Physical Vapor Deposition. The Chemical Vapor Deposition may be thermal Chemical Vapor Deposition (thermal CVD) process or high density plasma (HDP) process.

The thickness of the deposition may be determined by the size of the semiconductor apparatus and is not limited here.

Third, referring to FIGS. 3F1 and 3F2, etching through the fifth dielectric layer 312 and the third dielectric layer 309, respectively, to expose the upper electrode layer 3084 at the bottom of the first cavity 313. The plan view of the first cavity 313 is a first polygon 3130. The first polygon 3130 may have at least one pair of parallel sides, as shown in FIG. 3F2.

The first cavity 313 may be formed by first forming a photoresist layer on the fifth dielectric layer 312 to define the position and shape of the first cavity 313. The photoresist layer covers to-be-retained region and may be formed by spin coating, exposure and development on the fifth dielectric layer 312. Then the first cavity 313 may be formed by etching a portion of the fifth dielectric layer 312 and the third dielectric layer 309 that is not covered by the photoresist layer until the upper electrode layer 3084 is exposed.

The etching process used to form the first cavity 313 may be a dry etching or a wet etching process. The dry etching process may be Reactive Ion Etching (RIE), ion etching, plasma etching, or laser cutting. The etching agent can be, for example, oxygen-based gas if plasma etching is used.

Last, referring to FIG. 3G, a first bonding layer 401 may be formed on a first assistant substrate 400. The first bonding layer 401 is bonded with the fifth dielectric layer 312 to seal the first cavity 313.

The first assistant substrate 400 works as a supportive foundation, it may be made of any semiconductor substrate materials such as silicon, alumina ceramic, quartz, or glass.

The first bonding layer 401 may be made of silicon-based oxide and may be deposited by thermal oxidation, Chemical Vapor Deposition, or Physical Vapor Deposition.

In one embodiment, the first bonding layer 401 may be bonded with the fifth dielectric layer 312 by melted bonding. A thickness reduction process may be optionally applied on a side of the base substrate 300 that is opposing the sides that contacts the first dielectric layer 303, the thickness reduction process may be an etching process or a Chemical Mechanical Polishing (CMP) process. FIG. 3G shows the base substrate 300 after the thickness reduction process.

This concludes the first method that may be used to construct and seal the first cavity 313.

Referring to FIG. 3H to 3L, a second method to construct and seal the first cavity 313 comprises the following steps:

First, referring to FIG. 3H, before patterning the piezoelectric film 3083 and the upper electrode layer 3084, a first sacrificial material layer 3071 is formed to completely fill the first cavity 313. A planarization process is applied to the first sacrificial material layer 3071 to remove excess first sacrificial layer 3071 that is outside the first cavity 313, the planarization process may be a CMP process and will stop upon reaching the upper electrode layer 3084. Then a first cover layer 307a is formed on the upper electrode layer 3084 and the remaining first sacrificial material layer 3071.

The material used for the first sacrificial material layer 3071 will have a higher etching selectivity rate than the materials used for the upper electrode layer 3084, the first cover layer 307a, the third dielectric layer 309, and the fifth dielectric layer 312. For example, when silicon oxide is used for the first cover layer 307a, the third dielectric layer 309, and the fifth dielectric layer 312, the material used for the first sacrificial material layer 3071 may be silicon nitride (SiN) or silicon carbonitride (SiCN). The first sacrificial material layer 3071 may be formed by Chemical Vapor Deposition or Physical Vapor Deposition.

The first cover material layer 307a may be made of one of many dielectric materials including, but not limited to, silicon-based oxide, nitride, or oxynitride. For example, it may be made of silicon oxide, silicon nitride, silicon carbide, or silicon oxynitride. The first cover layer 307a may be formed by Chemical Vapor Deposition.

Second, referring to FIG. 3I, patternize the first cover layer 307a, the piezoelectric film 3083, and the upper electrode layer 3084; then form a third dielectric layer 309 on the first side of the base substrate 300; apply a planarization process on the third dielectric layer 309. After the planarization process, the third dielectric layer 309 should fully cover the upper surface of the first cover layer 307a.

The detail procedure of the patternization process and the process to form the third dielectric layer 309 are the same those shown in FIG. 3D.

Third, referring to FIG. 3J, a second contact hole 3101 may be formed to establish electrical connection to the lower electrode layer 305, the second contact hole 3101 goes through the third dielectric layer 309 and part of the second dielectric layer 306, respectively. A third contact hole 3102 may be formed to establish electrical connection to the upper electrode layer 3084. The third contact hole 3102 goes through a portion of the dielectric layer 309 that is on top of the upper electrode layer 3084. A second metal connecting layer 311 may be formed on the third dielectric layer 309. Two different portions of the second metal connecting layer 311 electrically connect to the second contact hole 3101 and the third contact hole 3102, respectively, these two portions of the second metal connecting layer 311 are not electrically connected to each other. Form a fifth dielectric layer 312 to cover the third dielectric layer 309 and the second metal connecting layer 311.

The detail procedure of this process is the same as that described in FIG. 3E.

Fourth, referring to FIG. 3K, a first release hole may be formed to expose the first sacrificial material layer 3071 that is inside the first cavity 313. The first release hole goes through the fifth dielectric layer 312, the third dielectric layer 309, and the first cover layer 307a, respectively, before reaching the first sacrificial material layer 3071. Then the first cavity 313 may be formed by completely removing the first sacrificial material layer 3071 through the first release hole. The first cavity 313 may be sealed by filling the first release hole with a first sealing material 314.

Specifically, to carry out this process, a photoresist layer that defines the position and shape of the first release hole may be formed on the fifth dielectric layer 312 by spin coating, exposure and development. Then the first release hole may be formed by etching a portion of the fifth dielectric layer 312, the third dielectric layer 309, and the first cover layer 307a that is not covered by the photoresist layer until the first sacrificial material layer 3071 is exposed.

The etching process used to form the first release hole may be a dry etching or a wet etching process. The dry etching process may be Reactive Ion Etching (RIE), ion etching, plasma etching, or laser cutting. The etching agent can be, for example, oxygen-based gas if plasma etching is used.

In one embodiment, a wet etching process using an etching agent that has a higher etching selectivity rate than the material used in the first sacrificial material layer 3071 may be used to remove the first sacrificial material layer 3071. For example, when the first sacrificial material layer 3071 is made of silicon nitride, phosphoric acid may be used as the etching agent to remove the first sacrificial material layer 3071.

The first sealing material layer 314 may be made of any sealing material that is well known to a person having ordinary skill in the art in this field, such as silicon dioxide. The material may also be the same material that has been used for any aforementioned dielectric layer. The first sealing material layer 314 may be formed by Chemical Vapor Deposition or Physical Vapor Deposition.

The upper electrode layer 3084, the piezoelectric film 3083 and the adhesive layer 3082 are conformally deposited in the first opening 307, but these layers do not completely fill the first opening 307. The unfilled portion of the first opening 307 has a similar plan view as the plan view of the opening before the deposition of these layers. For example, their plan views may both be polygons that have at least one pair of parallel sides. The first cavity 313 is the volume in the first opening 307 after the first sacrificial material layer 3071 has been removed, therefore the first cavity 313 also has a plan view of a polygon that may have at least one pair of parallel sides.

Last, referring to FIG. 3L, the first bonding layer 401 may be formed on a first assistant substrate 400, the first bonding layer 401 may be bonded to the first side of the base substrate 300. The bonding may be performed by molten oxide.

In one embodiment, a thicknesses reduction process may be optionally applied on a second side of the base substrate 300, wherein the second side is the side of the base substrate 300 that is opposing the first side of the base substrate 300.

The thickness reduction process may be an etching process or a CMP process. The detail procedure is the same as the description in FIG. 3G. FIG. 3L shows the base substrate 300 after the thicknesses reduction process.

This concludes the second method that may be used to construct and seal the first cavity 313.

After the first cavity 313 is formed, further processes will be applied to the second side of the base substrate 300.

Referring to FIG. 3M, part of the base substrate 300 is removed to expose the isolation trench layer 302. A fourth dielectric layer 315 is formed on the exposed surface of the isolation trench layer 302, such that the isolation trench layer 302 is positioned between the fourth dielectric layer 315 and the first dielectric layer 303.

Depending on the material used for the base substrate 300, different methods may be used to remove the base substrate 300. For example, when the base substrate 300 is made of silicon, it may be removed by etching or CMP.

The fourth dielectric layer 315 may be made of materials such as silicon-based oxide or nitride. For example, it may be made of silicon dioxide ($SiO_2$), carbon-fluorine compound (CF), carbon-doped silicon oxide (SiOC), silicon nitride (SiN), or silicon carbonitride (SiCN). Alternatively, the fourth dielectric layer 315 may also be made of carbon-fluorine compounds comprising silicon carbonitride (SiCN) film. The major components of the carbon-fluorine compound are fluorine (F) and carbon (C). The carbon-fluorine compounds may also be made of non-crystalline materials. The fourth dielectric layer 315 may also be made of the same material that has been used for any aforementioned dielectric layer.

The fourth dielectric layer 315 may be formed by any deposition process that is well known to a person having ordinary skill in the art in this field. For example, it may be Chemical Vapor Deposition or Physical Vapor Deposition. The Chemical Vapor Deposition may be thermal Chemical Vapor Deposition (thermal CVD) process or high density plasma (HDP) process.

The thickness of the deposition may be determined by the size of the semiconductor apparatus and is not limited here.

Referring to FIG. 3N, a contact hole 316 may be formed to establish an electrical connection to the upper electrode layer 3084. The contact hole 316 goes through the fourth dielectric layer 315, the isolation trench layer 302, the first dielectric layer 303, and the piezoelectric film 3083 before reaching the upper electrode layer 3084. The contact hole 316 may further include a liner layer 3161 inside its inner wall and may be filled with a conductive material 3162.

The liner layer 3161 may be made of any of the liner materials including, but not limited to, silicon oxide or silicon nitride. Optimally, the liner layer 3161 may be made of silicon nitride. The methods to form the liner layer 3161 include, but not limited to, Chemical Vapor Deposition or Physical Vapor Deposition. The thickness of the liner layer 3161 may range from 200 to 1000 nanometer.

The conductive material 3162 may be any conductive material that is well known to a person having ordinary skill in the art in this field including, but not limited to, metallic material such as aluminum (Al), copper (Cu), or tungsten (W). The filling conductive material 3162 may also be doped semiconductor materials such as doped poly-silicon.

When additional layer is placed between the piezoelectric film 3083 and the lower electrode layer 305, the contact hole 316 will also go through the additional layer. For example, referring to FIG. 3N, when the separation layer 3081 and the adhesive layer 3082 are placed between the piezoelectric film 3083 and the lower electrode layer 305, the contact hole 316 will also go through the separation layer 3081 and the adhesive layer 3082.

The liner layer 3161 can prevent accidental electrical connection between the filling conductive material 3162 inside the contact hole 316 and the conductive materials that are not in the upper electrode layer 3084. The liner layer 3161 may also be formed only in a portion of the contact hole 316 that is inside the piezoelectric film 3083.

The lower electrode layer 305 may be deliberately made not to completely overlap with the piezoelectric film 3083 and the upper electrode layer 3084 when viewed in thickness direction to facilitate establishing connection of the aforementioned contact holes.

Referring to FIGS. 3O1 and 3O2, a second cavity 317 may be formed by etching the fourth dielectric layer 315, the isolation trench layer 302, and the first dielectric layer 303, respectively, until the lower electrode layer 305 is exposed. The second cavity 317 is facing the first cavity 313 and has a plan view of a second polygon 3170. The second polygon 3170 may have at least one pair of parallel sides, as shown in FIG. 3O2.

The second cavity 317 may be formed by first forming a photoresist layer on the fourth dielectric layer 315 to define the position and shape of the second cavity 317. The photoresist layer covers to-be-retained region and may be formed by spin coating, exposure and development on the fourth dielectric layer 315. Then the second cavity 317 may be formed by etching a portion of the fourth dielectric layer 315, the isolation trench layer 302, and the first dielectric layer 303 that is not covered by the photoresist layer until the lower electrode layer 305 is exposed.

The etching process used to form the second cavity 317 may be a dry etching or a wet etching process. The dry etching process may be Reactive Ion Etching (RIE), ion etching, plasma etching, or laser cutting. The etching agent can be, for example, oxygen-based gas if plasma etching is used.

The second cavity 317 is facing the first cavity 313. The plan view of each of these two cavities may be any polygon; for example, it may be a quadrilateral, a pentagon, or a hexagon. The plan views of these two cavities form an overlapped region that also has an outline of a polygon.

Then, the second cavity 317 will be sealed. Two of the methods that may be used to seal the second cavity 317 are described below.

Referring to FIGS. 3P and 3Q, the first method to seal the second cavity 317 comprises the following steps:

First, referring to FIG. 3P, a second bonding layer 501 may be formed on a second assistant substrate 500. Then the second bonding layer 501 is bonded with the fourth dielectric layer 315 to seal the second cavity 317. The second assistant substrate 500 works as a supportive foundation, it may be made of any semiconductor substrate materials such as silicon, alumina ceramic, quartz, or glass.

The second bonding layer 501 may be made of silicon-based oxide and may be deposited by thermal oxidation, Chemical Vapor Deposition, or Physical Vapor Deposition.

In one embodiment, the second bonding layer 501 may be bonded with the fourth dielectric layer 315 by melted bonding. A thickness reduction process may be optionally applied on a side of the first assistant substrate 400 that is opposing the side that contacts the first bonding layer 401, the thickness reduction process may be an etching process or a CMP process. FIG. 3P shows the first assistant substrate 400 after a thicknesses reduction process.

Referring to FIG. 3Q, the first assistant substrate 400 may also be completely removed after the thickness reduction process. The method to remove the first assistant substrate 400 may be any method that is well known to a person having ordinary skill in the art in this field, such as etching or a CMP process.

This concludes the first method that may be used to seal the second cavity 317.

Referring to FIGS. 3R and 3S1, a second method to seal the second cavity 317 comprises the following steps:

First, referring to FIG. 3R, a second sacrificial material layer 3171 is deposited to completely fill the second cavity 317. A planarization process is applied to the second sacrificial layer 3171 to remove excess second sacrificial material layer 3171 that is outside the second cavity 317, the planarization process may be a CMP process and will stop upon reaching the fourth dielectric layer 315. Then a second cover layer 317a may be formed to cover the fourth dielectric layer 315 and the remaining second sacrificial material layer 3171.

The material used for the second sacrificial material layer 3171 has a higher etching selectivity rate than the materials used in the fourth dielectric layer 315, the lower electrode layer 305, and the second cover layer 317a. For example, when silicon oxide is used for the fourth dielectric layer 315, the lower electrode layer 305, and the second cover layer 317a, the material used for the second sacrificial material layer 3171 may be silicon nitride (SiN) or silicon carbonitride (SiCN). The second sacrificial material layer 3171 may be formed by Chemical Vapor Deposition or Physical Vapor Deposition.

The second cover layer 317a may be made of one of many dielectric materials including, but not limited to, silicon-based oxide, nitride, or oxynitride. For example, it can be silicon oxide, silicon nitride, silicon carbide, or silicon oxynitride. The second cover layer 317a may be formed by Chemical Vapor Deposition.

Referring to FIG. 3R, a fifth contact hole 318 may be formed to establish electrical connection to the lower electrode layer 305. The fifth contact hole 318 goes through the second cover layer 317a, the fourth dielectric layer 315, the isolation trench layer 302, and the first dielectric layer 303, respectively, before reaching the lower electrode layer 305. A third metal connecting layer 319 may be formed on the second cover layer 317a.

Referring to FIG. 3R, a sixth dielectric layer 320 may be formed to cover the second cover layer 317a and the third metal connecting layer 319. The sixth dielectric layer 320 may be made of the same material that has been used for any aforementioned dielectric layer, any suitable dielectric material that is well known to a person having ordinary skill in the art in this field, such as silicon-based oxide or nitride.

Second, referring to FIG. 3S1, at least one second release hole may be formed to expose the second sacrificial material layer 3171. The second sacrificial material layer 3171 may be completely removed through the second release hole. After that, the second release hole may be sealed by the second sealing material 321.

Specifically, to carry out this process, a photoresist layer that defines the position and shape of the second release hole may be formed on the sixth dielectric layer 320 by spin coating, exposure and development. Then the second release hole may be formed by etching a portion of the sixth dielectric layer 320 and the second cover layer 317a that is not covered by the photoresist layer until the second sacrificial material layer 3171 is exposed.

The etching process used to form the second release hole may be a dry etching or a wet etching process. The dry etching process may be Reactive Ion Etching (RIE), ion etching, plasma etching, or laser cutting. The etching agent can be, for example, oxygen-based gas if plasma etching is used.

In one embodiment, a wet etching process using an etching agent that has a higher etching selectivity rate than the material used in the second sacrificial material layer 3171 may be used to remove the second sacrificial material layer 3171. For example, when the second sacrificial material layer 3171 is made of silicon nitride, phosphoric acid may be used as the etching agent to remove the second sacrificial material layer 3171.

The second sealing material 321 may be any sealing material that is well known to a person having ordinary skill in the art in this field, such as silicon dioxide. It may also be the same material that has been used for any aforementioned dielectric layer. The second sealing material layer 321 may be formed by Chemical Vapor Deposition or Physical Vapor Deposition.

This concludes the second method that may be used to seal the second cavity 317.

Referring to FIGS. 3S2 and 3S3, the plan views of first cavity 313 and the second cavity 317 are the first polygon 3130 and the second polygon 3170, respectively. The first polygon 3130 and the second polygon 3170 can be any polygon. For example, it can be a quadrilateral, a pentagon, or a hexagon.

Referring to FIG. 2B, when observed from thickness direction, the first and the second polygons overlap to form a third polygon 2070. The third polygon 2070 may be any polygon. For example, it may be a quadrilateral, a pentagon, a hexagon, a heptagon, or an octagon. The third polygon 2070 has no parallel sides, this design can reduce, if not eliminate, the interfering horizontal acoustic resonance that might otherwise originate from, and be reinforce by, the acoustic resonance film.

The essential elements of the FBAR of the inventive concept comprises the dielectric layers, the lower electrode layer 305, the piezoelectric film 3083, the adhesive layer 3082, the first cavity 313, and the second cavity 317.

As described above, the semiconductor apparatus of the inventive concept comprises an FBAR, that FBAR comprises a continuous acoustic resonance film that completely separates the first cavity 313 and the second cavity 317, there is no through-hole in the acoustic resonance film. Therefore, the FBAR and the semiconductor apparatus comprising of such an FBAR can offer better resonance performance.

This concludes the description of the FBAR, the semiconductor apparatus including such an FBAR, and the manufacturing method for the semiconductor apparatus. Some prerequisite, intermediate, or follow up procedures that may be needed for a complete manufacturing procedure are omitted in this description in the interest of conciseness.

While this inventive concept has been described in terms of several embodiments, there are alterations, permutations, and equivalents, which fall within the scope of this inventive concept. It should also be noted that there are many alternative ways of implementing the methods and apparatuses of the inventive concept. Furthermore, embodiments of the inventive concept may find utility in other applications. The abstract section is provided herein for convenience and, due to word count limitation, is accordingly written for reading convenience and should not be employed to limit the scope of the claims. It is therefore intended that the claims be interpreted as including all such alterations, permutations, and equivalents as fall within the true spirit and scope of the inventive concept.

What is claimed is:

1. A thin-film bulk acoustic resonator (FBAR) apparatus, comprising:
   a lower dielectric layer;
   a first cavity inside the lower dielectric layer;
   an upper dielectric layer on the lower dielectric layer;
   a second cavity inside the upper dielectric layer; and
   an acoustic resonance film that is positioned between and separating the first and the second cavities, wherein the acoustic resonance film includes a lower electrode layer, an upper electrode layer, and a piezoelectric film, wherein the piezoelectric film is sandwiched between the lower and upper electrode layers, and wherein the plan views of the first and the second cavities have an overlapped region having an outline of a polygonal shape without any parallel sides.

2. The apparatus of claim 1, wherein the plan view of the first cavity has an outline of a first polygon, which has at least one pair of parallel sides.

3. The apparatus of claim 1, wherein the plan view of the second cavity has an outline of a second polygon, which has at least one pair of parallel sides.

4. The apparatus of claim 1, wherein the acoustic resonance film further comprises:
   an adhesive layer that is positioned between the piezoelectric film and the lower electrode layer; and
   one or more insulation layers positioned in one or both of: between the adhesive layer and the lower electrode layer, and between the piezoelectric film and the upper electrode layer.

5. A semiconductor apparatus, comprising:
   an isolation trench layer;
   a first dielectric layer formed on a first side of the isolation trench layer;
   a lower electrode layer formed on the first dielectric layer, the lower electrode layer being above the isolation trench layer, and the first dielectric layer being positioned between the lower electrode layer and the isolation trench layer;
   a second dielectric layer formed on the first dielectric layer and the lower electrode layer;
   an opening in the second dielectric layer, the opening exposing part of the lower electrode layer and having a plan view in the shape of a polygon;
   a piezoelectric film formed to cover part of the second dielectric layer and fill part of the opening;
   an upper electrode layer formed on the piezoelectric film;
   a third dielectric formed to cover both the upper electrode layer and the second dielectric layer;
   a first cavity formed in the third dielectric layer, the first cavity having a plan view in the shape of a first polygon;
   a fourth dielectric layer formed on a second side of the isolation trench layer, so that the isolation trench layer is positioned between the fourth dielectric layer and the first dielectric layer;
   a second cavity extending through the fourth dielectric layer, the isolation trench layer, and the first dielectric layer and having a plan view of a second polygon, the first and second cavities facing each other and their plan views forming an overlapped region with an outline in the shape of a third polygon that does not have any parallel sides; and an acoustic resonance film comprising the lower electrode layer, the piezoelectric film, and the upper electrode layer.

6. The semiconductor apparatus of claim 5 further comprising:
a fifth dielectric layer on the third dielectric layer.

7. The semiconductor apparatus of claim 6, further comprising:
a first assistant substrate; and
a first bonding layer formed on the first assistant substrate and being bonded with the fifth dielectric layer to seal the first cavity, wherein the first cavity extending through the third and fifth dielectric layers and exposing at least part of the upper electrode layer.

8. The semiconductor apparatus of claim 6, further comprising:
a first cover layer positioned between the third dielectric layer and part of the upper electrode layer and sealing the first cavity; and
at least one first release hole extending through a portion of the first cover layer, the third dielectric layer, and the fifth dielectric layer that are on top of the first cavity, wherein the first release hole is filled and sealed by a first filling material, wherein the first filling material also covers the upper surface of the fifth dielectric layer.

9. The semiconductor apparatus of claim 5, further comprising:
a second assistant substrate; and
a second bonding layer formed on the second assistant substrate and being bonded with the fourth dielectric layer to seal the second cavity.

10. The semiconductor apparatus of claim 5, further comprising:
a second cover layer formed on the surface of the fourth dielectric layer and sealing the second cavity; and
at least one second release hole extending through a portion of the second cover layer that is facing the second cavity and being filled and sealed by a second filling material.

11. The semiconductor apparatus of claim 5, further comprising:
a contact hole extending through the fourth dielectric layer, the isolation trench layer, the first dielectric layer, and the piezoelectric film to electrically connect to the upper electrode layer, wherein the contact hole comprises a liner layer and a conductive material inside.

12. The semiconductor apparatus of claim 5, wherein the acoustic resonance film further comprises:
an adhesive layer positioned between the piezoelectric film and the lower electrode layer; and
one or more insulation layer positioned in at least one of: between the lower electrode layer and the adhesive layer, and between the upper electrode layer and the piezoelectric film.

* * * * *